United States Patent
Chen

(10) Patent No.: US 9,627,479 B2
(45) Date of Patent: Apr. 18, 2017

(54) CIRCUITS USING GATE-ALL-AROUND TECHNOLOGY

(71) Applicant: TAIWAN SEMICONDUCTOR MANUFACTURING COMPANY LTD., Hsinchu (TW)

(72) Inventor: Chung-Hui Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/048,677

(22) Filed: Feb. 19, 2016

(65) Prior Publication Data
US 2016/0172442 A1    Jun. 16, 2016

Related U.S. Application Data

(63) Continuation of application No. 14/681,523, filed on Apr. 8, 2015, now Pat. No. 9,281,363.
(Continued)

(51) Int. Cl.
*H01L 29/06*    (2006.01)
*H01L 27/088*    (2006.01)
(Continued)

(52) U.S. Cl.
CPC ...... *H01L 29/0676* (2013.01); *H01L 27/0207* (2013.01); *H01L 27/088* (2013.01);
(Continued)

(58) Field of Classification Search
CPC ............ H01L 29/0676; H01L 29/0657; H01L 29/0847; H01L 29/125; H01L 29/7827;
(Continued)

(56) References Cited

U.S. PATENT DOCUMENTS 7,087,920 B1    8/2006  Kamins
2008/0224115 A1    9/2008  Bakkers et al.
(Continued)

FOREIGN PATENT DOCUMENTS

TW    201347198    11/2013

OTHER PUBLICATIONS

Office action and search report dated Jun. 2, 2016 from the Taiwan counterpart application 104112172.
English abstract of TW 201347198.

*Primary Examiner* — Tu-Tu Ho
(74) *Attorney, Agent, or Firm* — WPAT, P.C.; Anthony King

(57) ABSTRACT

In some embodiments, a semiconductor structure includes first and second GAA structures configured to form corresponding similar first and second circuits. At least one of the first or second GAA structure includes at least one GAA device. A GAA device of the at least one GAA device includes at least one nanowire and a gate region. A nanowire of the at least one nanowire has a cross-section asymmetrical with respect to a middle line of the cross-section. The cross-section has first and second end lines substantially parallel the middle line. The first end line is shorter than the second end line. The gate region wraps all around part of the nanowire. The first and second GAA structures have substantially a same of a number of GAA devices in the at least one GAA device configured to have current flow from the first end line to the second end line.

20 Claims, 26 Drawing Sheets

Related U.S. Application Data

(60) Provisional application No. 61/981,598, filed on Apr. 18, 2014.

(51) Int. Cl.
*H01L 29/78* (2006.01)
*H01L 27/02* (2006.01)
*H01L 29/423* (2006.01)
*H01L 29/66* (2006.01)
*H01L 21/8234* (2006.01)

(52) U.S. Cl.
CPC .. *H01L 29/42392* (2013.01); *H01L 29/66666* (2013.01); *H01L 29/7827* (2013.01); *H01L 21/823487* (2013.01)

(58) Field of Classification Search
CPC ......... H01L 29/42392; H01L 29/66666; H01L 27/0207; H01L 27/088
USPC ............................................................. 257/9
See application file for complete search history.

(56) References Cited

U.S. PATENT DOCUMENTS

| | | |
|---|---|---|
| 2008/0272366 A1 | 11/2008 | Moon et al. |
| 2010/0176459 A1 | 7/2010 | Wernersson et al. |
| 2012/0298959 A1 | 11/2012 | Verhulst et al. |
| 2013/0285019 A1* | 10/2013 | Kim ...................... H01L 29/775 257/29 |

* cited by examiner

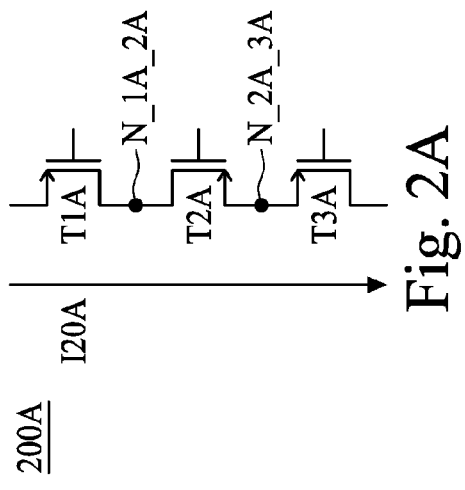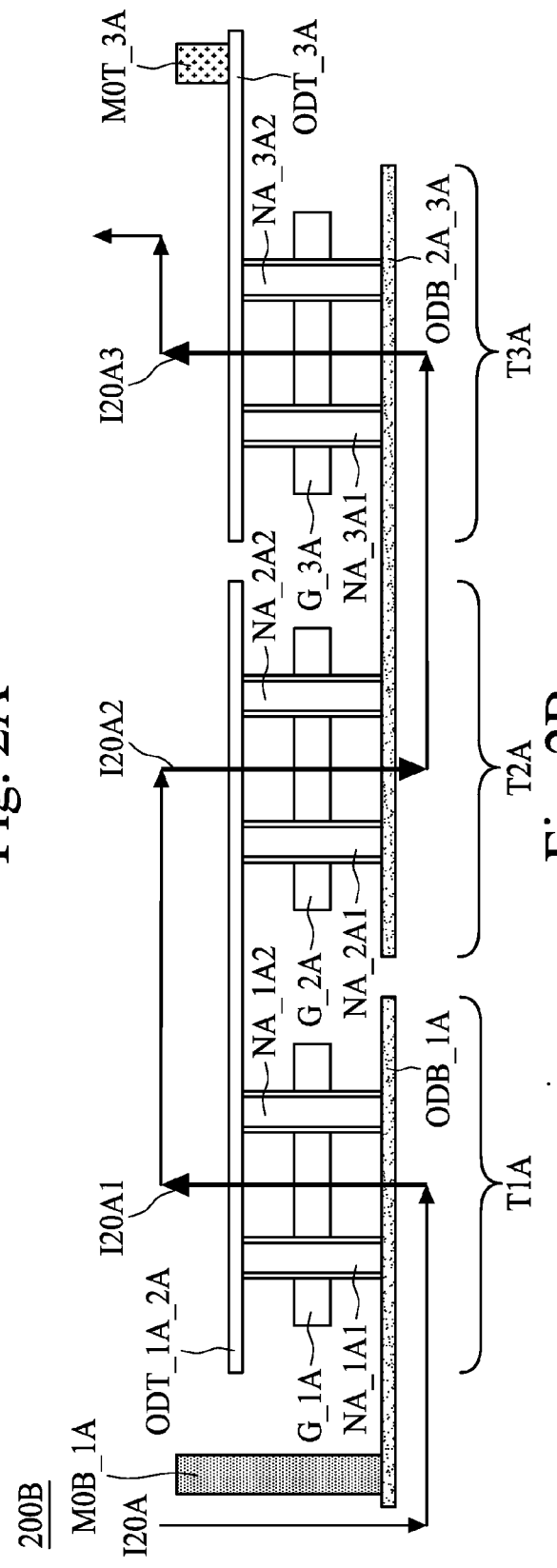

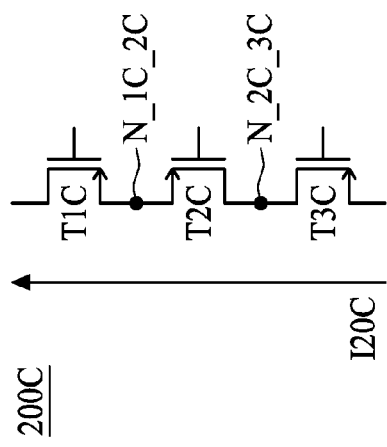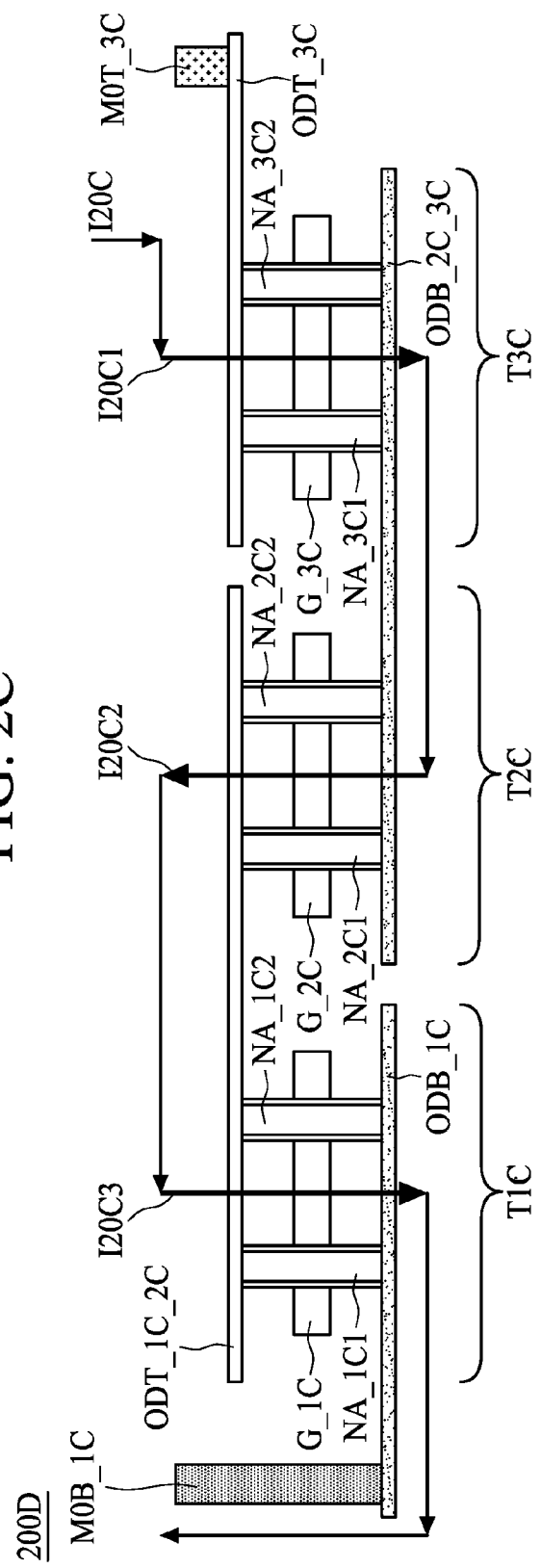

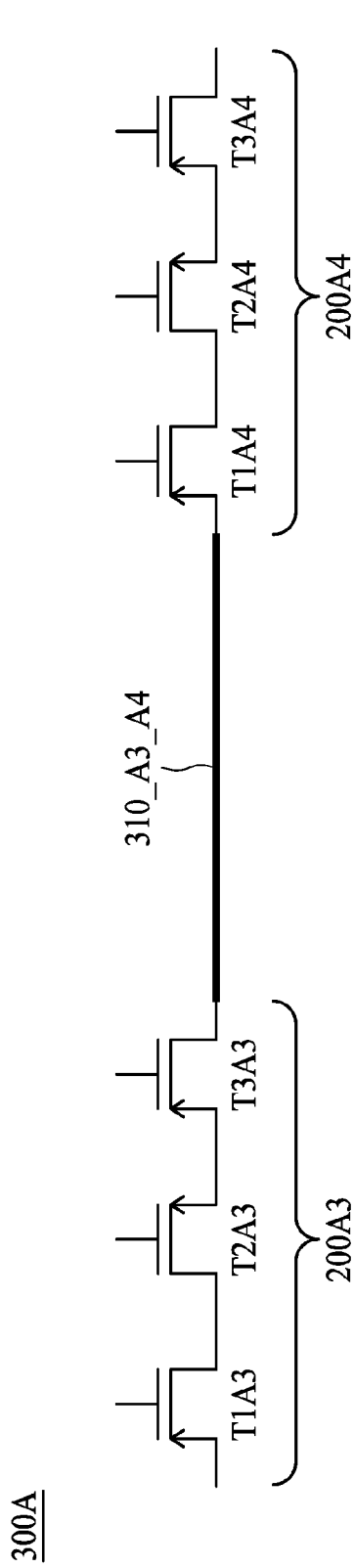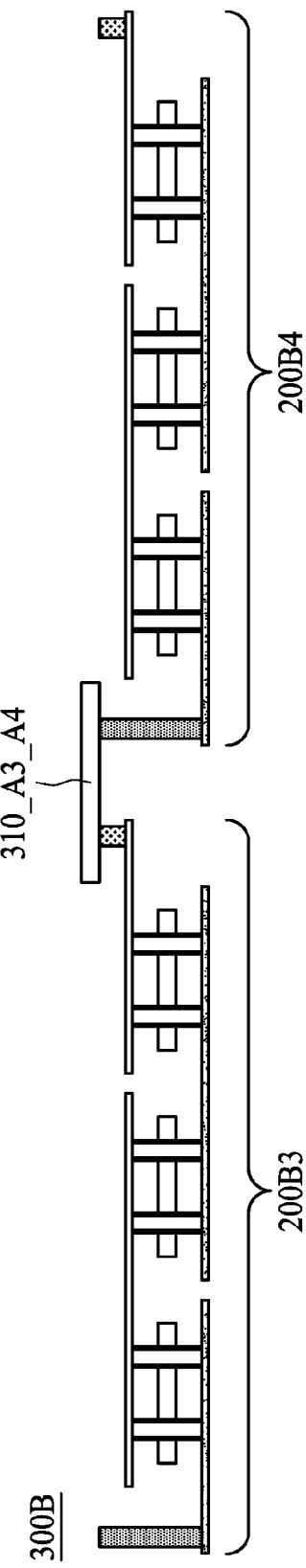
Fig. 3A
Fig. 3B

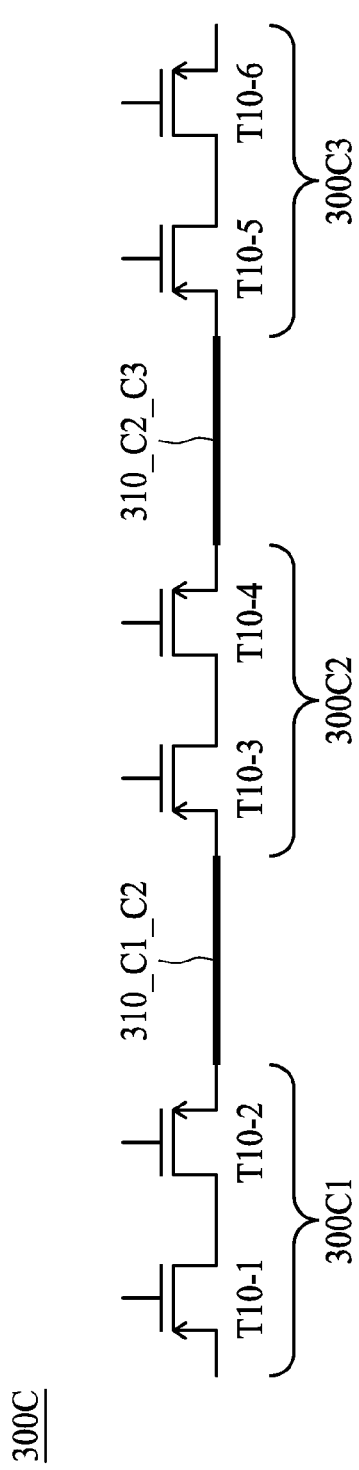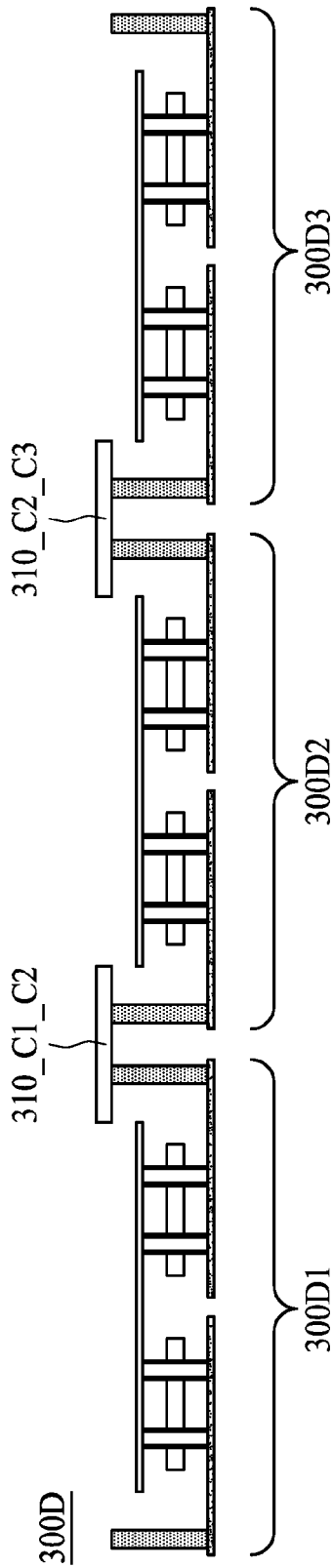
Fig. 3C
Fig. 3D

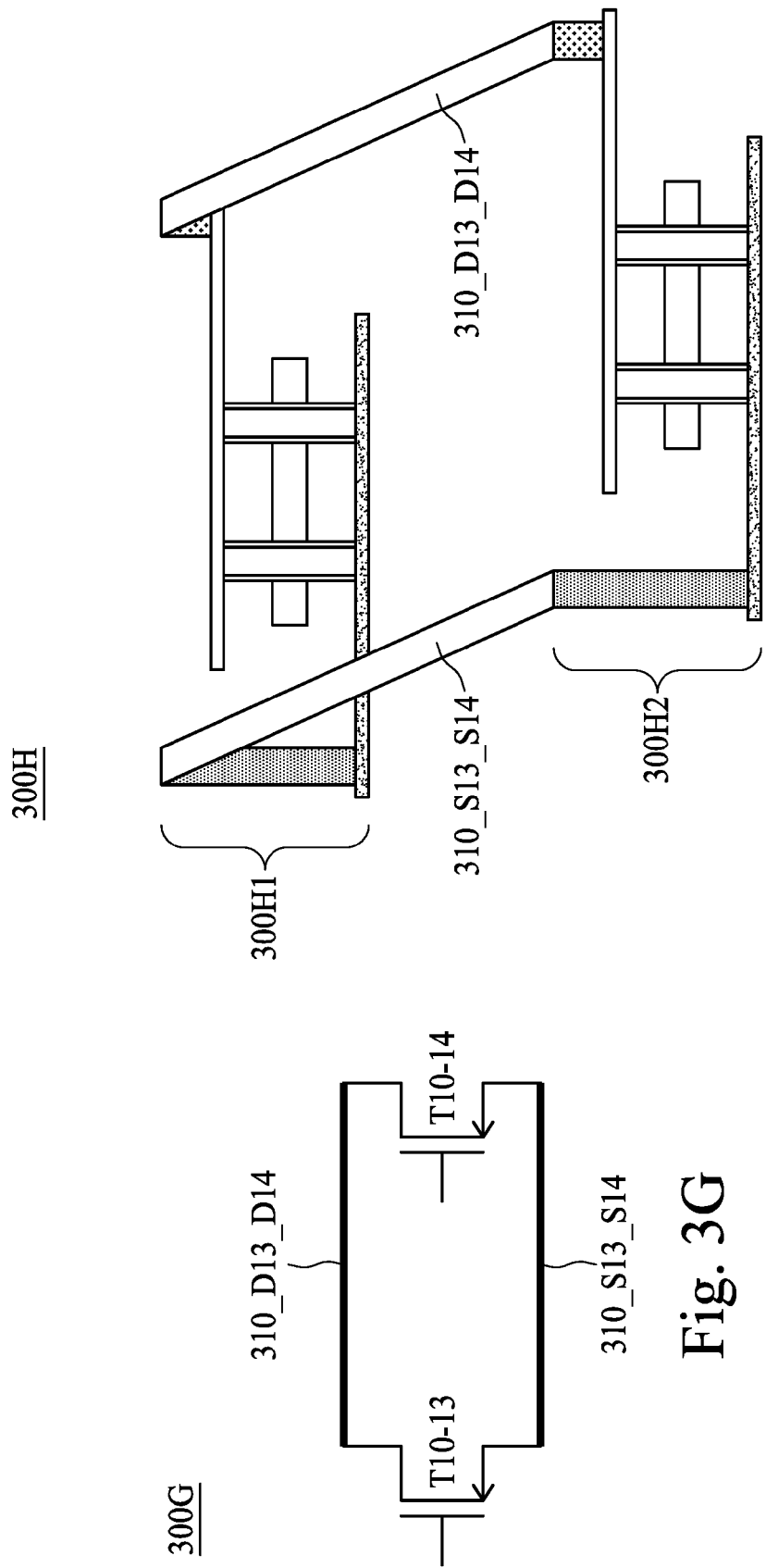

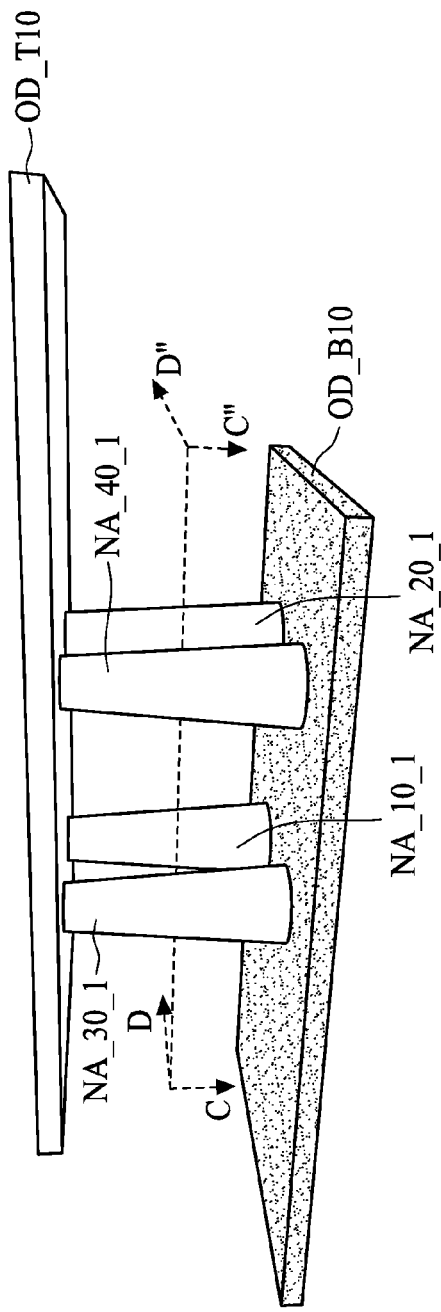
Fig. 5D-1
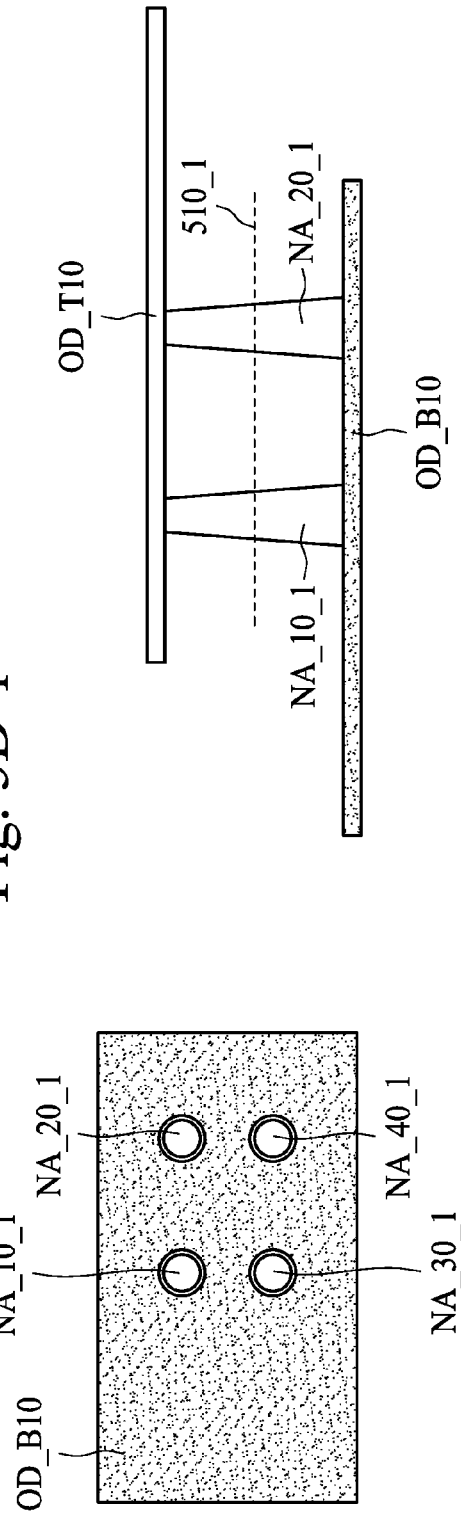
Fig. 5D-3
Fig. 5D-2

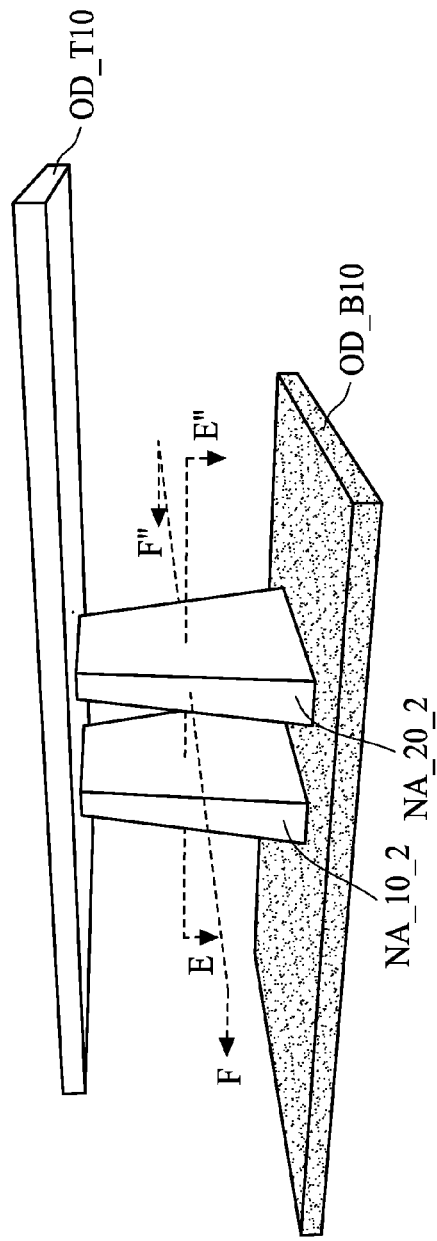
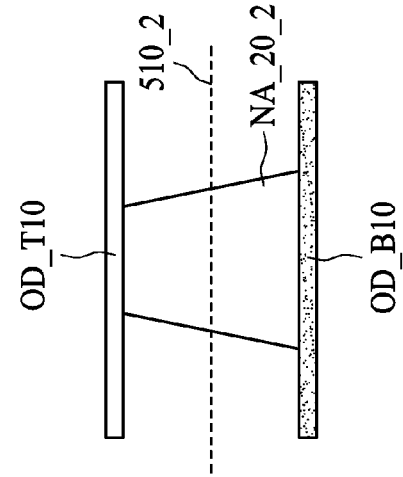
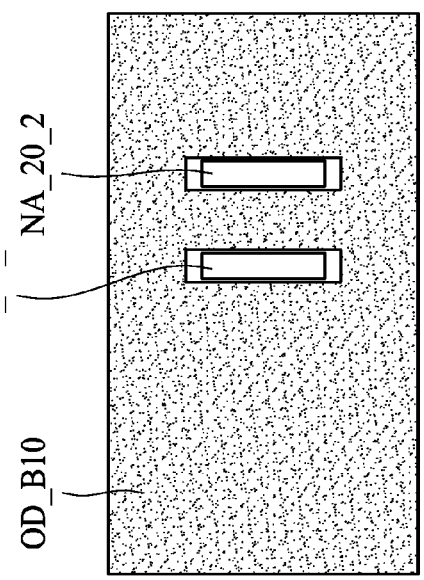
Fig. 5E-1
Fig. 5E-3
Fig. 5E-2

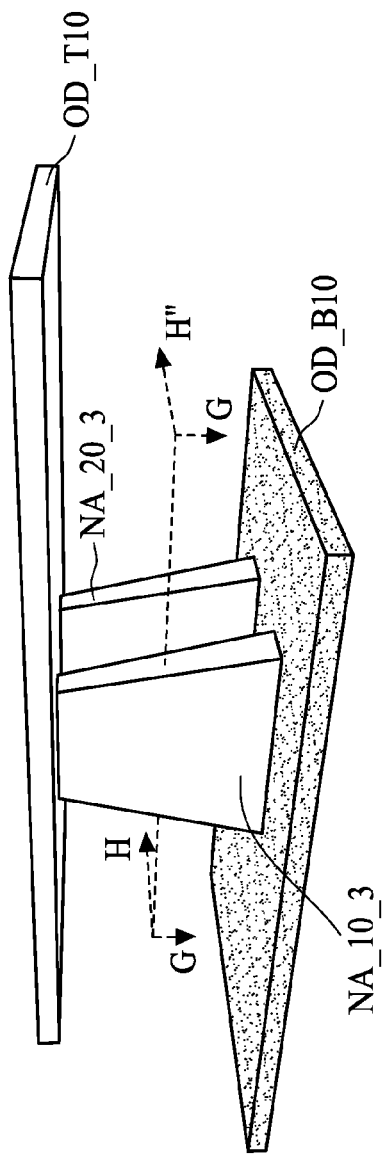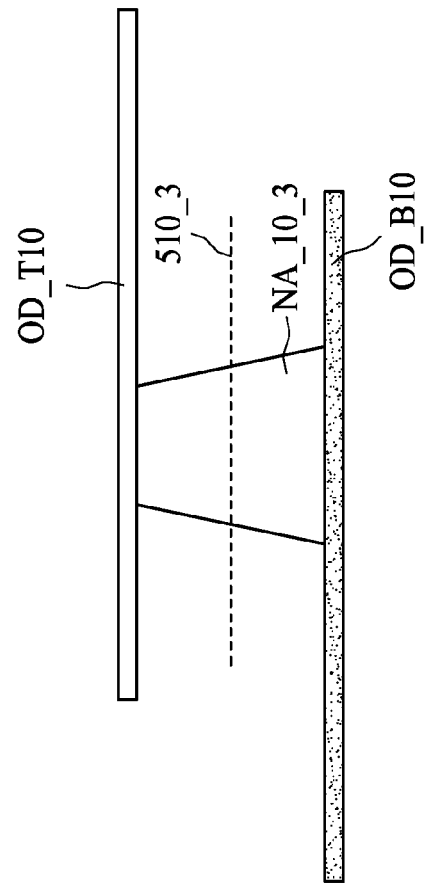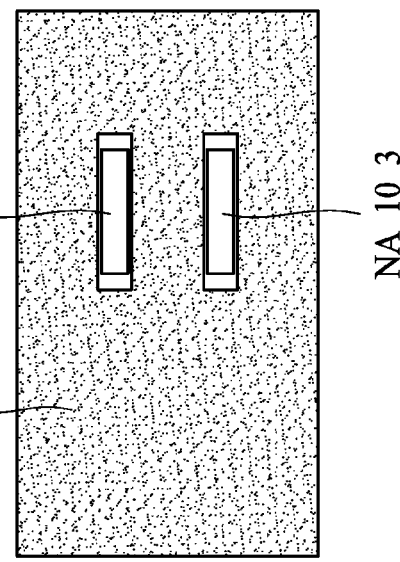
Fig. 5F-1
Fig. 5F-3
Fig. 5F-2

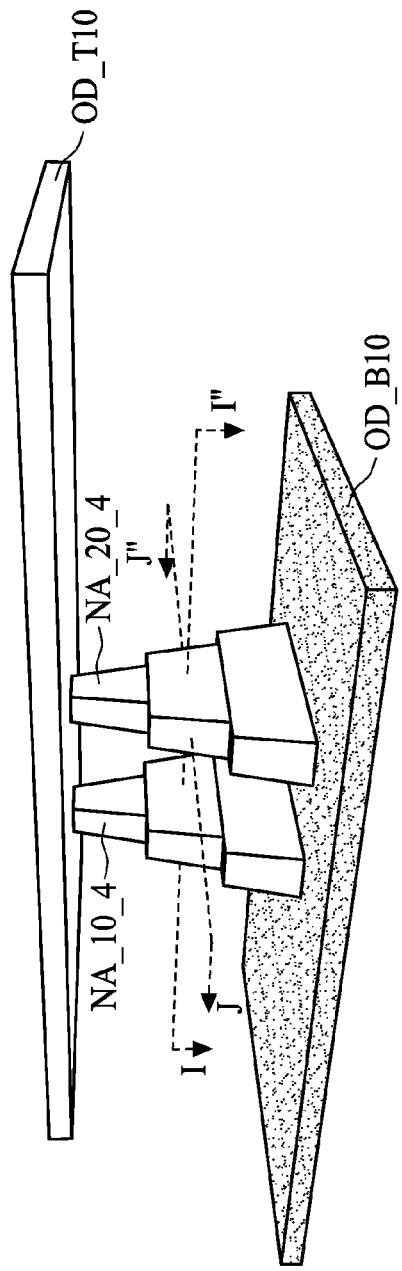
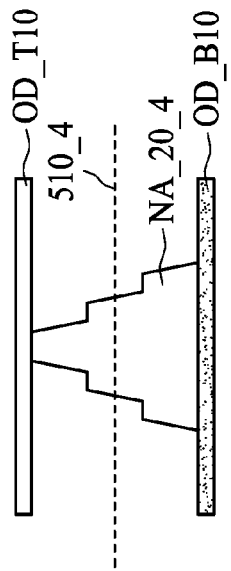
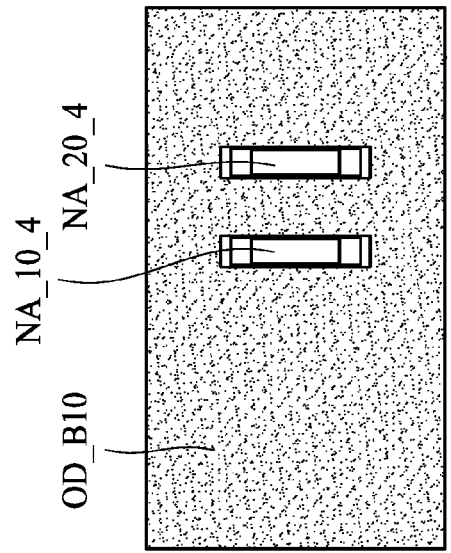
Fig. 5G-1
Fig. 5G-3
Fig. 5G-2

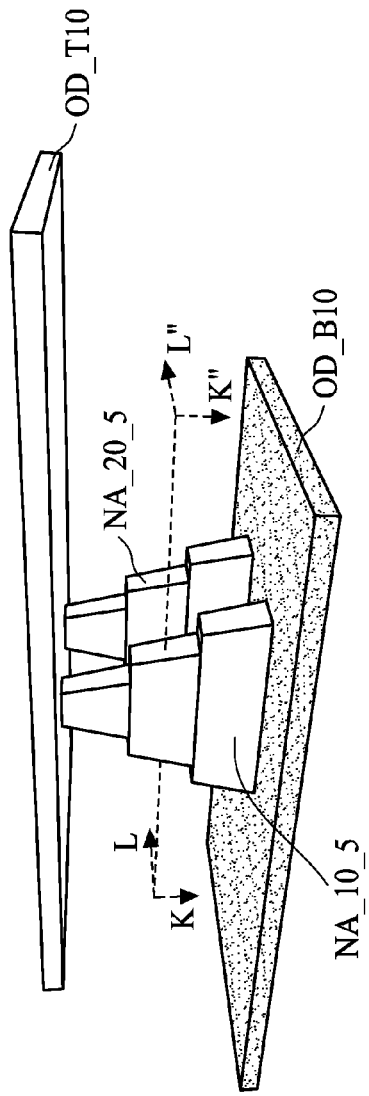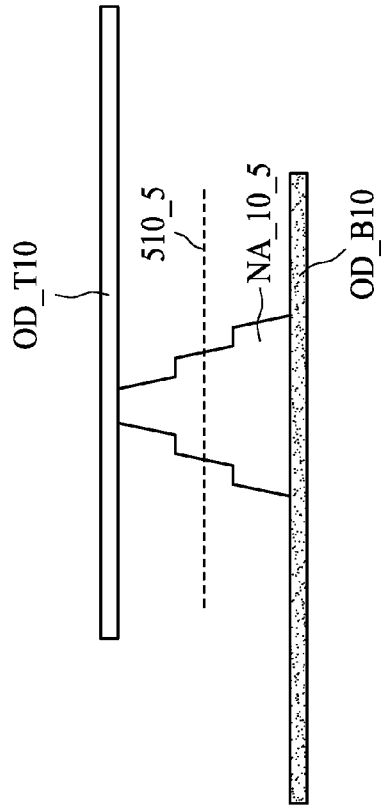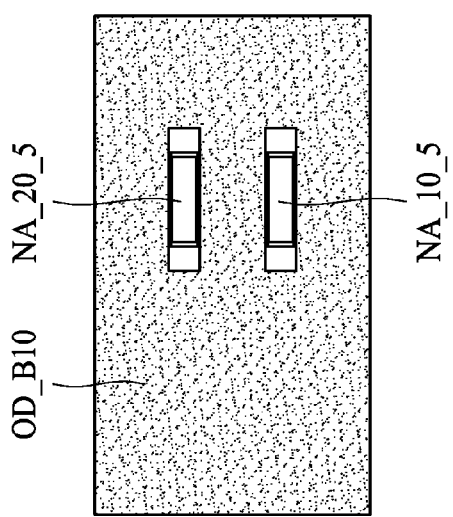

CIRCUITS USING GATE-ALL-AROUND TECHNOLOGY

PRIORITY CLAIM AND CROSS-REFERENCE

This application is a continuation application of U.S. Non-Provisional application Ser. No. 14/681,523 filed on Apr. 8, 2015 which claims priority to U.S. Provisional Application Ser. No. 61/981,598 filed on Apr. 18, 2014, and the disclosure of which is hereby incorporated by reference in its entirety.

BACKGROUND

Gate-all-around (GAA) is a relatively new technology in semiconductor paradigm. As a result, designing circuits using such technology is challenging.

BRIEF DESCRIPTION OF THE DRAWINGS

The details of one or more embodiments of the disclosure are set forth in the accompanying drawings and the description below. Other features and advantages will be apparent from the description, drawings, and claims.

FIGS. 2A-2B are diagrams used to illustrate a current direction of an exemplary circuit, in accordance with some embodiments.

FIGS. 2C-2D are diagrams used to illustrate a current direction of another exemplary circuit, in accordance with some embodiments.

FIGS. 3A-3B are diagrams used to illustrate an exemplary series connection of two circuits, in accordance with some embodiments.

FIGS. 3C-3D are diagrams used to illustrate an exemplary series connection of three circuits, in accordance with some embodiments.

FIGS. 3G-3H are diagrams used to illustrate an exemplary parallel connection of two circuits, in accordance with some embodiments.

FIGS. 5D-1-5H-3 are diagrams used to illustrate GAA structures having nanowires with different shapes, in accordance with some embodiments.

Like reference symbols in the various drawings indicate like elements.

DETAILED DESCRIPTION

Figure 1A:
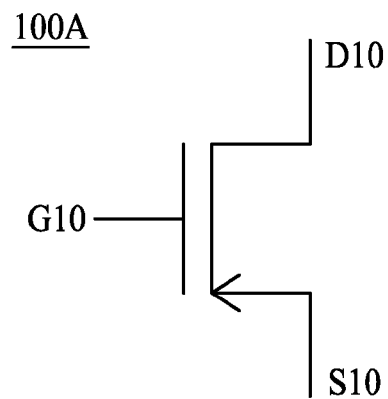
FIGS. 1A-1D are diagrams of different aspects of an exemplary transistor formed by gate-all-around technology, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, gate-all-around technology is used to form various circuits. For example, in some embodiments, regarding a first circuit similar to a second circuit, the first circuit and the second circuit are configured such that at least one of the following features in the first circuit and in the second circuit is substantially the same: a number of current paths flowing from a top oxide diffusion (ODT) region to a bottom oxide diffusion (ODB) region, a number of current paths flowing from an ODB region to an ODT region, a number of ODB regions, a layout orientation of an ODB region, a number of ODT regions, a layout orientation of an ODT region, a number of ODB region contact elements, a layout orientation of an ODB region contact element, a number of ODT region contact elements, a layout orientation of an ODT region contact element, a layout orientation of and a corresponding direction of current flow through the first circuit or the second circuit, a number of nanowires in an array, a number of rows of nanowires in the array, a number of nanowires in an row, a number of columns of nanowires in the array, a number of nanowires in an column, and a shape of nanowires.

Gate-all-Around Structure

FIGS. 1A-D are diagrams of different aspects of an exemplary transistor built by a gate-all-around (GAA) technology, in accordance with some embodiments. In some embodiments, GAA is also called vertical GAA or VGAA.

Figure 1B:
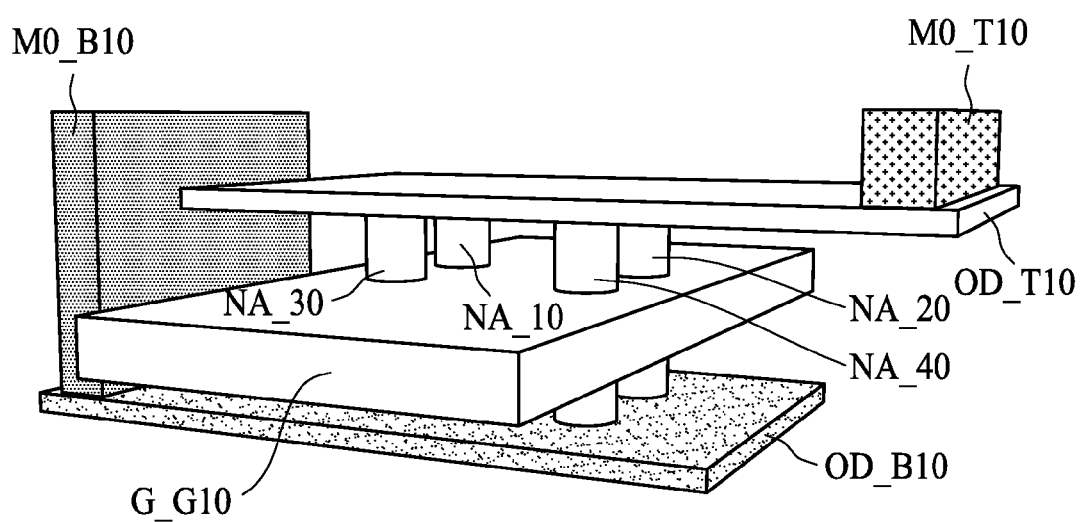
Figure 1C:
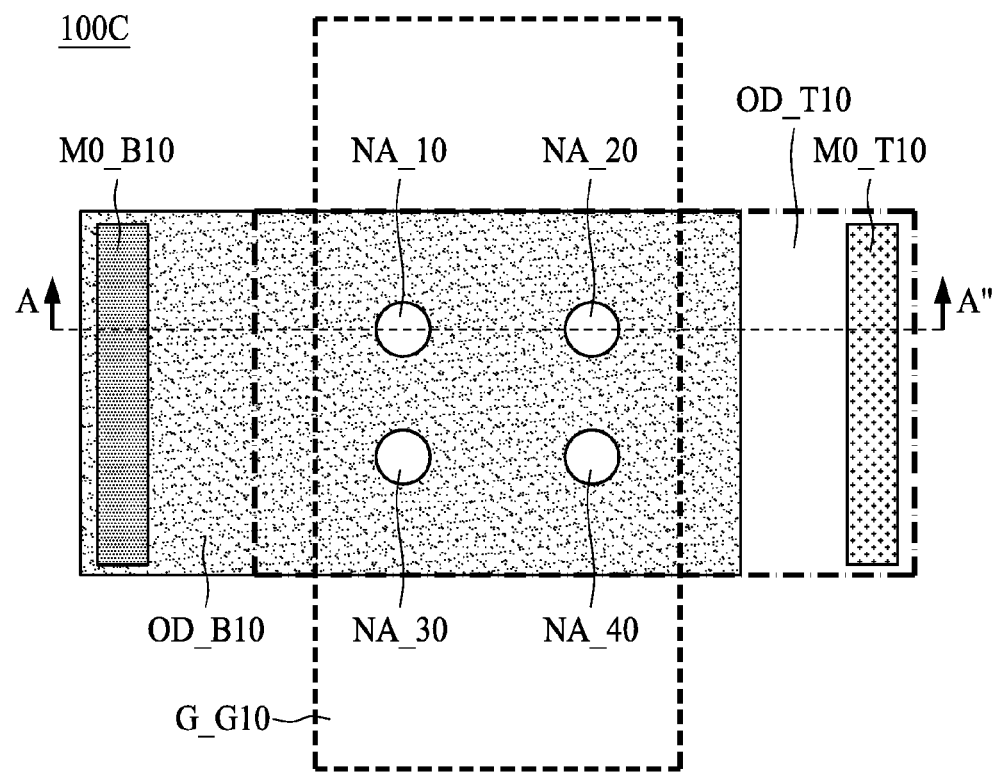
Figure 1D:
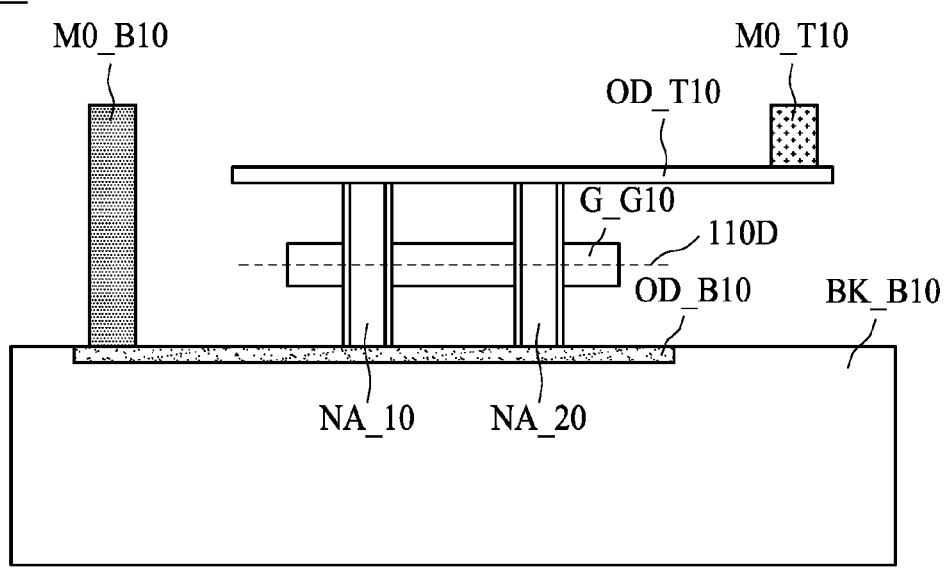

FIG. 1A is a diagram of an exemplary P-type transistor 100A. FIG. 1B is a perspective diagram of a GAA structure 100B used to form transistor 100A, in accordance with some embodiments. FIG. 1C is a layout diagram 100C of structure 100B, in accordance with some embodiments. FIG. 1D is a cross-section diagram 100D at line AA" in FIG. 1C, in accordance with some embodiments.

For illustration, in FIG. 1A, transistor 100A includes a source S10, a drain D10, and a gate G10.

In FIG. 1B, in some embodiments, a bottom OD region OD_B10 forms source S10, and a top OD region OD_T10 forms drain D10. In various embodiments, a bottom OD region is used to form a drain, and a top OD region is used to form a source. For example, bottom OD region OD_B10 is used to form drain D10, and top OD region OD_T10 is used to form source S10.

Gate region G_G10 and nanowires NA_10, NA_20, NA_30, NA_40 form gate G10. Four nanowires NA_10, NA_20, NA_30, NA_40 are used for illustration. Another number of nanowires used to form gate G10 is within the contemplated scope of the disclosure. Different shapes of nanowires including those of nanowires NA_10, NA_20, NA_30, NA_40 are within the contemplated scope of the present disclosure. From a cross-section viewpoint, exemplary shapes of nanowires include rectangles, squares, triangles, tapered shapes, or combination thereof. Nanowires with vertical cross sections that have continuous tapered shapes and horizontal cross sections that have shapes of circles are exemplarily shown in FIGS. 5D-1 to 5D-3. Nanowires with vertical cross sections that have continuous tapered shapes and horizontal cross sections that have shapes of rectangles are exemplarily shown in FIGS. 5E-1 to 5F-3. Nanowires with vertical cross sections that have stepwise tapered shapes and horizontal cross sections that have shapes of rectangles are exemplarily shown in FIGS. 5G-1 to 5H-3. In some embodiments, so that a first current path from an ODB region to an ODT region and a second current path from the same ODT region to the same ODB region have a same absolute value, nanowires are configured such that the nanowires are symmetrical. For example, in FIG. 1D, nanowires NA_10 and NA_20 are each configured to be symmetrical with reference to line 110D, which is at half point of each nanowire NA_10 or NA_20. In other embodiments, the nanowires are asymmetrical with reference to line 110D in FIG. 1D such as the nanowires having the tapered shapes exemplarily illustrated in FIGS. 5D-1 to 5H-3. Nanowires are used for illustration, other type of wires used with a gate region to form a gate of transistors are within the contemplated scope of the present disclosure.

ODB region contact element M0_B10 is coupled with bottom OD region OD_B10 and serves as a contact terminal for source S10. For example, ODB region contact element M0_B10 is coupled with bottom OD region OD_B10 and with a metal element in metal layer M1 (not shown), so that bottom OD region OD_B10 is electrically coupled with other components through the metal element in metal layer M1. Similarly, ODT region contact element M0_T10 is coupled with top OD region OD_T10 and serves as a contact terminal for drain D10. For example, ODT region contact element M0_T10 is coupled with top OD region OD_T10 and with a metal element in metal layer M0, so that top OD region OD_T10 is electrically coupled with other components through the metal element in metal layer M1.

As illustratively shown in FIG. 1B, ODB region contact element M0_B10 and ODT region contact element M0_T10 are each a plane substantially parallel to one another. Contact elements M0_B10 and M0_T10 arranged in different directions are within the contemplated scope of the present disclosure. For example, in some embodiments, contact elements M0_B10 and M0_T10 are substantially orthogonal to one another, as will be explained with reference to FIGS. 1E, 1F, and 1G.

In some embodiments, the term "substantially parallel" or "substantially orthogonal" for a first direction and a second direction refers to the first direction within a deviation angle such as 5 degrees, 10 degrees, and 15 degrees, etc., from a reference direction. For "substantially parallel", the reference direction is the second direction, and for "substantially orthogonal", the reference direction is 90 degrees from the second direction. Other ways to determine the first direction being "substantially parallel" or substantially orthogonal" to the second direction are within the contemplated scope of the present disclosure. For example, a ratio of a deviation angle of the first direction from a first reference direction and a deviation angle of the second direction from a second reference direction is greater than a percentage such as 85%, 90% and 95%, etc. For "substantially parallel", the first reference direction is the same as the second reference direction, and for "substantially orthogonal", the first reference direction is 90 degrees from the second direction. For another example, a difference between a deviation angle of the first direction from the first reference direction and a deviation angle of the second direction from the second reference direction is less than a percentage such as 5%, 10% and 15%, etc., of the deviation angle of the second direction from the reference direction.

In FIG. 1D, bottom OD region OD_B10 is included in a bulk BK_B10, which, for simplicity, is not shown in FIGS. 1A-1C. In some embodiments, bulk BK_B10 is part of a substrate used to form semiconductor devices. The nanowire NA_10 or NA_20 is vertical with respect to the substrate BK_B10. The nanowire NA_10 or NA_20 has opposite ends connected to the corresponding top OD region OD_T10 and bottom OD region OD_B10. One end of the nanowire NA_10 or NA_20 is closer to the substrate BK_B10 while the other end of the nanowire NA_10 or NA_20 is further away from the substrate BK_B10.

Figure 1E:
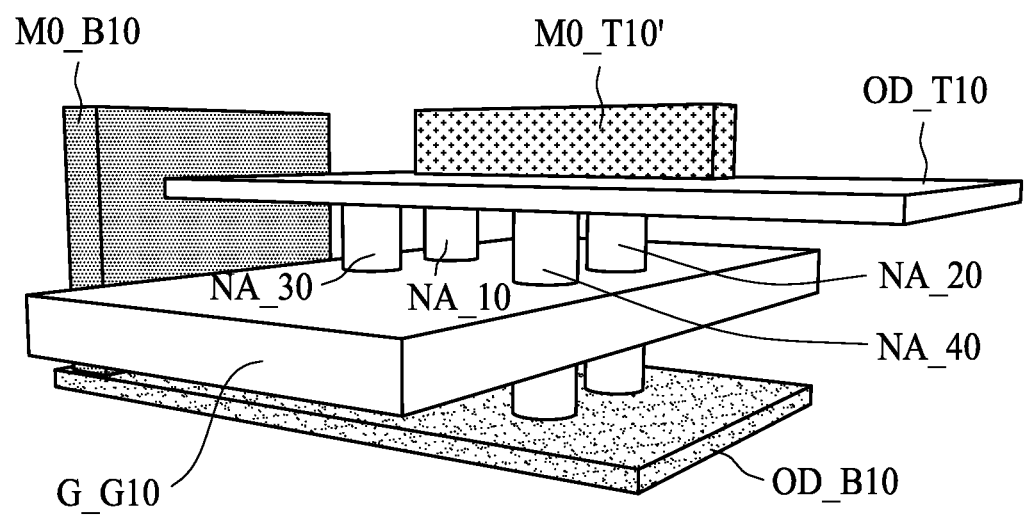
FIGS. 1E-1G are diagrams of further different aspects of the transistor in FIG. 1A, in accordance with some embodiments.
Figure 1F:
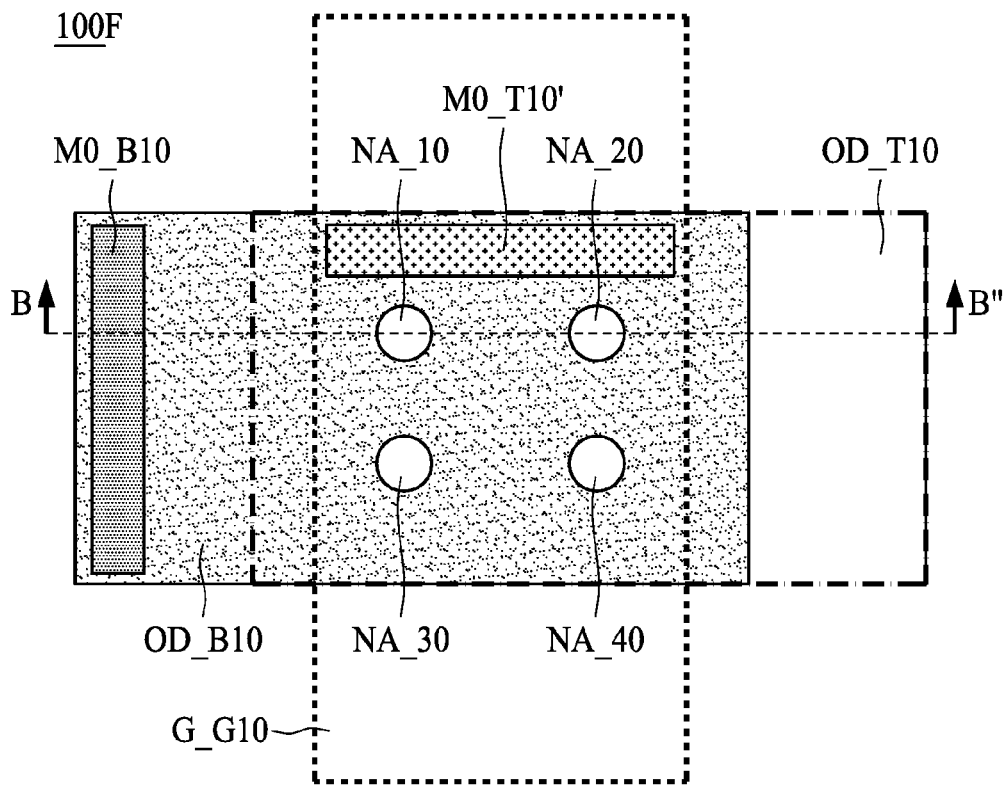
Figure 1G:
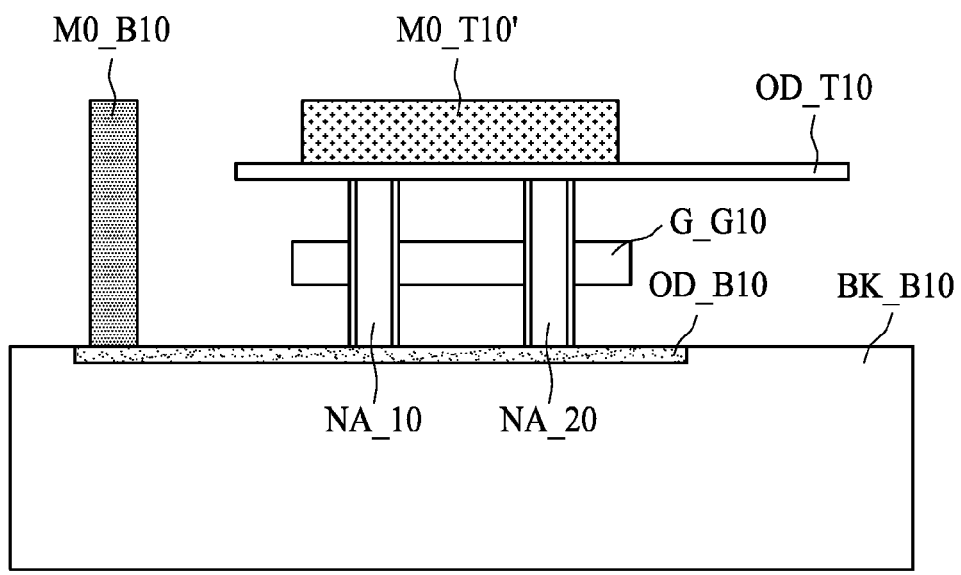

FIG. 1E is a diagram of a GAA structure 100E used to form transistor 100A in FIG. 1A, in accordance with some embodiments. GAA structure 100E is different from GAA structure 100B used to form the same transistor 100A. FIG. 1F is a layout diagram 100F of structure 100E, in accordance with some embodiments. FIG. 1G is a cross-section diagram 100D at line BB" in FIG. 1F. FIG. 1G also includes a side-view of the ODT region contact element M0_T10' viewed at line BB" in FIG. 1F.

Compared GAA structure 100E in FIG. 1E with GAA structure 100B in FIG. 1B, ODT region contact element M0_T10' corresponds to ODT region contact element M0_T10. Further, ODB region contact element M0_B10 and ODT region contact element M0_T10' in FIG. 1E are each a plane substantially orthogonal to one another. In contrast, ODB region contact element M0_B10 and ODT region contact element M0_T10 in FIG. 1B are each a plane substantially parallel to one another.

FIG. 1E illustrates one way for ODB region contact element M0_B10 and ODT region contact element M0_T10' to be substantially orthogonal to one another. Different ways for an ODB region contact element and an ODT region contact element to be substantially orthogonal to one another are within the contemplated scope of the present disclosure.

FIGS. 1F and 1G show ODT region contact element M0_T10' corresponding to ODT region contact element M0_T10' in FIG. 1E. Other elements in FIGS. 1F and 1G are the same as in corresponding FIGS. 1C and 1D.

In the above description with reference to FIGS. 1A-1G, P-type transistor 100A is used for illustration. N-type transistors are within the contemplated scope of the present disclosure. In various embodiments, P- or N-type transistors are formed according to dopants in OD regions OD_B10 and OD_T10. Further, a particular element having a particular shape in FIGS. 1A-1G (and the below Figs.) is also for illustration. Elements in different Figs. are not limited to a particular shape and/or size.

In the below description, an ODB region contact element and an ODT region contact element substantially parallel to one another is used for illustration. An ODB region contact element not substantially parallel an ODT region contact element is within the contemplated scope of the present disclosure. For example, in various embodiments, an ODB region contact element and an ODT region contact element are substantially orthogonal to one another, as illustrated in FIGS. 1E, 1F, and 1G, and are within the contemplated scope of the present disclosure.

Current Paths

FIGS. 2A-D are used to illustrate two different current paths of two exemplary circuits. FIGS. 2B and 2D are two cross-section diagrams representing two corresponding circuits in FIGS. 2A and 2C.

FIG. 2A is a circuit diagram of an exemplary circuit 200A, in accordance with some embodiments. FIG. 2B is a cross-section diagram of a GAA structure 200B used to form circuit 200A, in accordance with some embodiments.

Circuit 200A includes three transistors T1A, T2A, and T3A coupled in series. Transistors T1A, T2A and T3A are P-type. The drain of transistor T1A is coupled with the drain of transistor T2A at node N_1A_2A. The source of transistor T2A is coupled with the source of transistor T3A at node N_2A_3A.

As illustratively shown in FIG. 2A, a current I20A flows from the source of transistor T1A through transistors T1A, T2A, T3A to the drain of transistor T3A.

Similar to transistor 100A in FIG. 1A, each of transistors T1A, T2A, and T3A includes a gate region that together with a plurality of nanowires forms a gate for a corresponding transistor. For illustration, nanowires of transistors T1A are called nanowires NA_1A, including nanowires NA_1A1 and NA_1A2 as illustratively shown in FIG. 2B. Nanowires of transistors T2A are called nanowires NA_2A, including nanowires NA_2A1 and NA_2A2, and nanowires of transistors T3A are called nanowires NA_3A, including nanowires NA_3A1 and NA_3A2. Gate region G_1A and nanowires NA_1A form the gate of transistor T1A. Gate region G_2A and nanowires NA_2A form the gate of transistor TA2, and gate region G_3A and nanowires NA_3A form the gate of transistor T3A.

Similar to transistor 100A in FIG. 1A, each of transistors T1A, T2A and T3A further includes a top OD region and a bottom OD region that forms a drain and source, or a source and drain of a corresponding transistor. As the transistors T1A, T2A and T3A are coupled in series, corresponding OD regions of adjacent transistors T1A and T2A, or T2A and T3A are integrated as one OD region ODT_1A_2A or ODB_2A_3A. An integral OD region of a GAA structure 200B is a continuous doping region which extends within one transistor such as bottom OD region ODB_1A of transistor T1A or across transistors such as top OD region ODT_1A_2A of transistors T1A and T2A.

Bottom OD region ODB_1A forms the source of transistor T1A. ODB region contact element M0B_1A is coupled with bottom OD region ODB_1A. Effectively, ODB region contact element M0B_1A is coupled with the source of transistor T1A, and is used to couple the source of transistor T1A to other circuit elements.

Top OD region ODT_1A_2A forms the drain of transistor T1A and the drain of transistor T2A, and corresponds to node N_1A_2A in FIG. 2A.

Bottom OD region ODB_2A_3A forms the source of transistor T2A and the source of transistor T3A, and corresponds to node N_2A_3A in FIG. 2A.

Top OD region ODT_3A forms the drain of transistor T3A.

ODT region contact element M0T_3A is coupled with top OD region ODT_3A. Effectively, ODT region contact element M0T_3A is coupled with the drain of transistor T3A, and is used to couple the drain of transistor T3A to other circuit elements.

In GAA structure 200B of FIG. 2B, current I20A is shown flowing through various components of transistors T1A, T2A, T3A. For example, current I20A flows through ODB region contact element M0B_1A, bottom OD region ODB_1A, nanowires NA_1A, top OD region ODT_1A_2A, nanowires NA_2A, bottom OD region ODB_2A_3A, nanowires NA_3A, top OD region ODT_3A, and ODT region contact element M0T_3A.

With reference to a current flow between two OD regions, current I20A flows through three current paths I20A1, I20A2, and I20A3. Current path I20A1 is from bottom OD region ODB_1A to top OD region ODT_1A_2A. Current path I20A2 is from top OD region ODT_1A_2A to bottom OD region ODB_2A_3A. Current path I20A3 is from bottom OD region ODB_2A_3A to top OD region ODT_3A. Effectively, current I20A flows through two paths from bottom OD to top OD regions and one path from top OD region to bottom OD region.

FIG. 2C is a circuit diagram of an exemplary circuit 200C, in accordance with some embodiments. FIG. 2D is a cross-section diagram of a GAA structure 200D used to form circuit 200C, in accordance with some embodiments.

Circuit 200C includes three transistors T1C, T2C, and T3C coupled in series. Transistors T1C, T2C and T3C are P-type. The source of transistor T1C is coupled with the source of transistor T2C at node N_1C_2C. The drain of transistor T2C is coupled with the drain of transistor T3C at node N_2C_3C.

As illustratively shown in FIG. 2C, a current I20C flows from the source of transistor T3C through transistors T3C, T2C, T1C to the drain of transistor T1C.

Similar to transistor 100A in FIG. 1A, each of transistors T1C, T2C, and T3C includes a gate region that together with a plurality of nanowires forms a gate for a corresponding transistor. For illustration, nanowires of transistors T1C are called nanowires NA_1C, including nanowires NA_1C1 and NA_1C2 as illustratively shown in FIG. 2D. Nanowires of transistors T2C are called nanowires NA_2C, including nanowires NA_2C1 and NA_2C2, and nanowires of transistors T3C are called nanowires NA_3C, including nanowires NA_3C1 and NA_3C2. Gate region G_1C and nanowires NA_1C form the gate of transistor T1C. Gate region G_2C and nanowires NA_2C form the gate of transistor T2C, and gate region G_3C and nanowires NA_3C form the gate of transistor T3C.

Bottom OD region ODB_1C forms the drain of transistor T1C. ODB region contact element M0B_1C is coupled with bottom OD region ODB_1C. Effectively, contact element M0B_1C is coupled with the drain of transistor T1C, and is used to couple the drain of transistor T1C to other circuit elements.

Top OD region ODT_1C_2C forms the source of transistor T1C and the source of transistor T2C, and corresponds to node N_1C_2C in FIG. 2C.

Bottom OD region ODB_2C_3C forms the drain of transistor T2C and the drain of transistor T3C, and corresponds to node N_2C_3C in FIG. 2C.

Top OD region ODT_3C forms the source of transistor T3C.

ODT region contact element M0T_3C is coupled with top OD region ODT_3C. Effectively, ODT region contact element M0T_3C is coupled with the source of transistor T3C, and is used to couple the source of transistor T3C to other circuit elements.

In GAA structure 200D of FIG. 2D, current I20C is shown flowing through various components of transistors T3C, T2C, T1C. For example, current I20C flows through ODT region contact element M0T_3C, top OD region ODT_3C, nanowires NA_3C, bottom OD region ODB_2C_3C, nanowires NA_2C, top OD region ODT_1C_2C, nanowires NA_1C, bottom OD region ODB_1C, and ODB region contact element M0B_1C.

With reference to a current flow between two OD regions, current I20C flows through three current paths I20C1, I20C2, and I20C3. Current path I20C1 is from top OD region ODT_3C to bottom OD region ODB_2C_3C. Current path I20C2 is from bottom OD region ODB_2C_3C to top OD region ODT_1C_2C. Current path I20C3 is from top OD region ODT_1C_2C to bottom OD region ODB_1C. Effectively, current I20C flows through two paths from top OD to bottom OD regions and one path from bottom OD region to top OD region.

In various embodiments of the present disclosure, two similar circuits are configured such that the two similar circuits have two corresponding currents with the same current direction. For illustration, the two similar circuits have corresponding cross section diagrams 200B and 200D. In some embodiments, the two similar circuits are configured to have the same two corresponding currents I20A, or the same two corresponding currents I20C. Effectively, the two similar circuits are configured to be two circuits 200A, or two circuits 200B, as illustratively shown in FIGS. 2E and 2F.

Figure 2E:
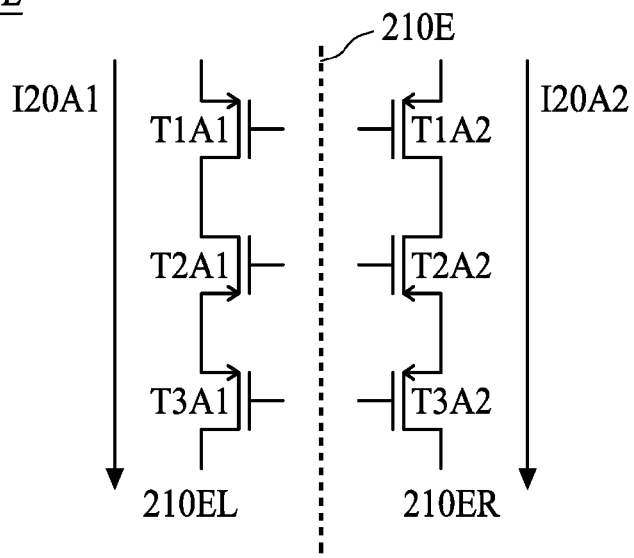
FIGS. 2E-2F are diagrams used to illustrate exemplary similar circuits, in accordance with some embodiments.

FIG. 2E is a diagram of a circuit 200E, in accordance with some embodiments. Circuit 200E is symmetrical with reference to a line 210E, and includes a circuit 210EL and a circuit 210ER, which are each the same as circuit 200A. Circuit 210EL includes transistors T1A1, T2A1, T3A1 being the same as transistors T1A, T2A, T3A, respectively. As a result, a current I20A1 of circuit 210EL is the same as current I20A. Similarly, circuit 210ER includes transistors T1A2, T2A2, T2A3 being the same as transistors T1A, T2A, T3A, respectively. As a result, a current I20A2 of circuit 210ER is the same as current I20A. Consequently, circuit 200E has two similar circuits 210EL, 210ER and two corresponding similar currents I20A1, I20A2.

In addition, in various embodiments of the present disclosure, two similar circuits are configured such that the two similar circuits have the same number of current paths from bottom OD to top OD regions, and from top OD to bottom OD regions. For example, because circuits 210EL and 210ER are each the same as circuit 200A, circuits 210EL and 210ER each include two current paths from bottom OD to top OD regions and one current path from top OD region to bottom OD region.

Figure 2F:
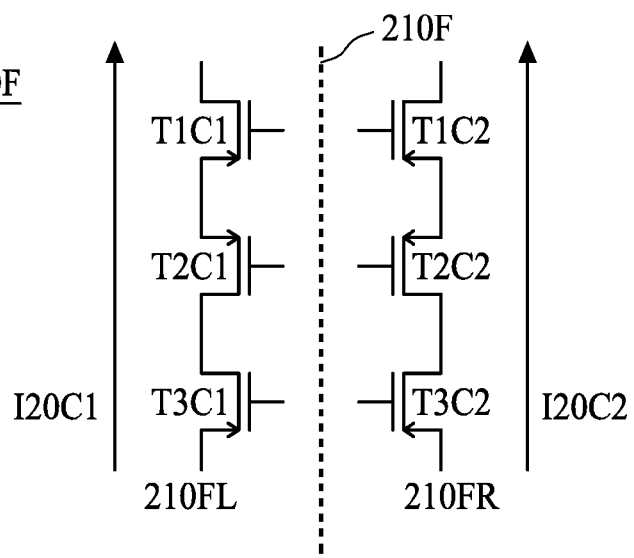

FIG. 2F is a diagram of a circuit 200F, in accordance with some embodiments. Circuit 200F is symmetrical with reference to a line 210F, and includes a circuit 200FL and a circuit 200FR, which are each the same as circuit 200C in FIG. 2C.

Circuit 210FL includes transistors T1C1, T2C1, T3C1 being the same as transistors T1C, T2C, T3C, respectively. As a result, a current I20C1 of circuit 210FL is the same as current I20C. Similarly, circuit 210FR includes transistors T1C2, T2C2, T3C2 being the same as transistors T1C, T2C, T3C, respectively. As a result, a current I20C2 of circuit 210FR is the same as current I20C. Consequently, circuit 200F has two similar circuits 210FL, 210FR and two corresponding similar currents I20C1, I20C2.

Further, because circuits 210EL and 210ER are each the same as circuit 200C, circuits 210FL and 210FR each include one current path from bottom OD to top OD regions and two current paths from top OD to bottom OD regions.

Different Configurations

Figure 2G:
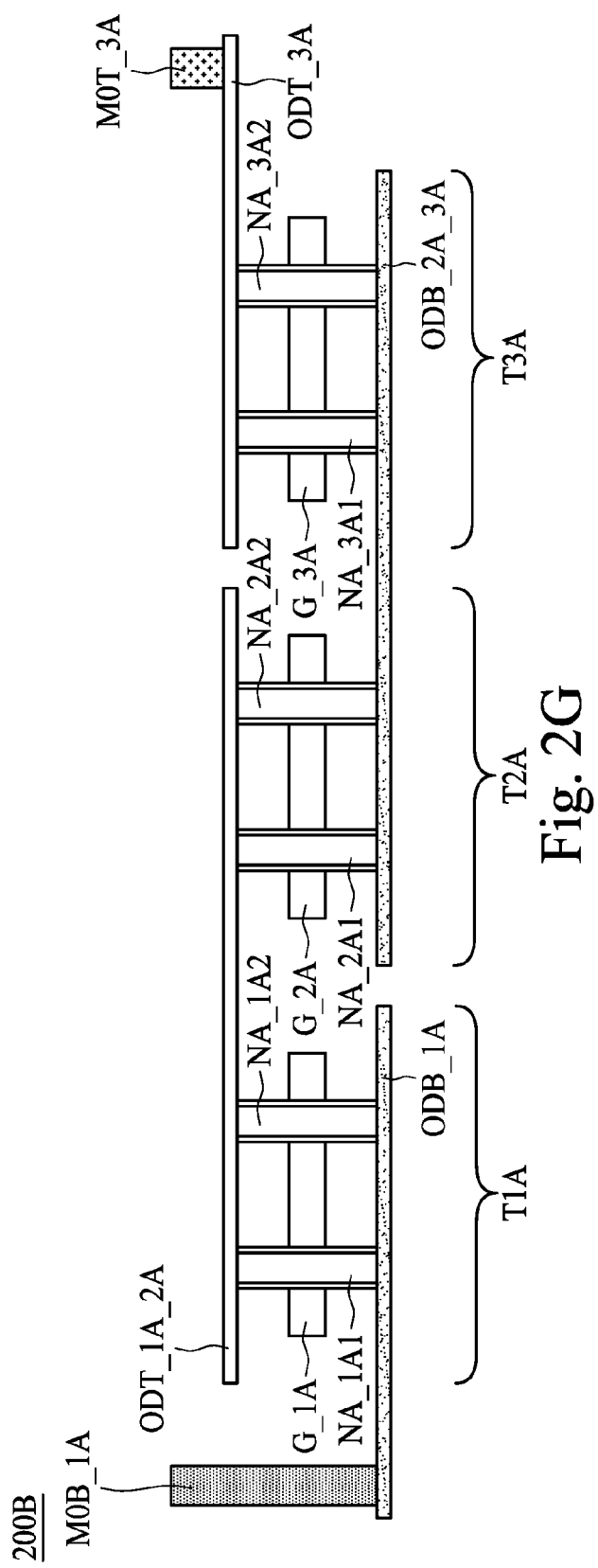
FIG. 2G is a cross-section diagram of the GAA structure in FIG. 2B reproduced to explain further aspects related to the structure.

FIG. 2G is cross-section diagram of GAA structure 200B reproduced for further illustrations.

In FIG. 2G, structure 200B includes one ODB region contact element M0B_1A, two bottom OD regions ODB_1A, ODB_2A_3A, two top OD regions ODT_1A_2A, ODT_3A, one ODT region contact element M0T_3A, and six nanowires NA_1A1, NA_1A2, NA_2A1, NA_2A2, NA_3A1, NA_3A2.

Bottom OD region ODB_2A_3A is used to form both sources of transistors T2A and T3A, and is for illustration. Explained in a different way, the sources of transistors T2A and T3A are coupled together. Other ways to couple the sources of transistors T2A and T3A are within the contemplated scope of the present disclosure. For example, each of the source of transistors T2A and T3A is formed by a separate bottom OD region, such as bottom OD regions ODB_2A (not labeled) and ODB_3A (not labeled), respectively. Further, each of bottom OD regions ODB_2A and ODB_3A is coupled with a corresponding ODB region contact element, such as M0B_2A (not label) and M0B_3A (not label), respectively. ODB region contact elements M0B_2A and M0B_3A are then coupled by a conductive line to effectively couple the sources of transistors T2A and T3A together. As the bottom OD regions of transistors T2A and T3A are configured differently, the number of bottom OD regions and corresponding ODB region contact elements for circuit 200A change accordingly.

Similarly, top OD region ODT_1A_2A is used to form both drains of transistors T1A and T2A, and is for illustration. Explained in a different way, the drains of transistors T1A and T2A are coupled together. Other ways to couple the drains of transistors T1A and T2A are within the contemplated scope of the present disclosure. For example, each of the drain of transistors T1A and T2A is formed by a separate top OD region, such as top OD regions ODT_1A (not labeled) and ODT_2A (not labeled), respectively. Further, each of top OD regions ODT_1A and ODT_2A is coupled with a corresponding ODT region contact element, such as M0T_1A (not label) and M0T_2A (not label), respectively. Drain contact elements M0T_1A and M0T_2A are then coupled by a conductive line to couple the drains of transistors T1A and T2A together. As the top OD regions of transistors T1A and T2A are configured differently, the number of top OD regions and corresponding ODT region contact elements for circuit 200A change accordingly.

In various embodiments of the present disclosure, a number of ODB region contact elements, a number of bottom OD regions, a number of top OD regions, a number of ODT region contact elements, a number of nanowires in an array, a number of nanowires in a row of the array, a number of rows of the array, a number of nanowires in a column of the array, a number of columns of the array, and combinations thereof are considered in configuring circuits using GAA technology. For example, in some embodiments, regarding a first circuit similar to a second circuit, the first circuit and the second circuit are configured such that at least one of the following feature in the first circuit and in the second circuit is substantially the same: a number of ODB region contact elements, a number of ODT region contact elements, a number of bottom OD regions, a number of top OD regions, a number of nanowires in an array, a number of nanowires in a row of the array, a number of rows of the array, a number of nanowires in a column of the array, a number of columns of the array. In some embodiments, the term "substantially the same" for a first number or a first value and a second number or a second value refers to a ratio of the first number to the second number being greater than a percentage such as 85%, 90%, or 95%, etc. Other ways to determine the first number being "substantially the same" as the second number are within the contemplated scope of the present disclosure. For example, a deviation of the first number from the second number is less than a percentage such as 5%, 10%, and 15%, etc., of the second number. For another example, the deviation of the first number from the second number is less than a predetermined number determined according to design specification.

In various embodiments, the number of ODB region contact elements, the number of ODT region contact elements, the number of bottom OD regions, the number of top OD regions, the number of nanowires in an array, the number of nanowires in a row of the array, the number of rows of the array, the number of nanowires in a column of the array, and/or the number of columns of the array of a principal circuit varies depending on how the GAA structures of sub-circuits of the principal circuit are configured to form the GAA structure of the principal circuit. FIGS. 3A-H are used to illustrate various variations.

Serial Configurations

FIG. 3A is a diagram of an exemplary circuit 300A, in accordance with some embodiments. FIG. 3B is a cross-section diagram of a GAA structure 300B used to form circuit 300A, in accordance with some embodiments.

Circuit 300A includes circuits 200A3 and 200A4 coupled in series by a conductive line 310 A3 A4 at the drain of transistor T3A3 and the source of transistor T1A4. Circuit 200A3 and 200A4 are each the same as circuit 200A in FIG. 2A. For example, circuit 200A3 includes transistors T1A3, T2A3, T3A3 corresponding to transistors T1A, T2A, T3A, respectively. Similarly, circuit 200A4 includes transistors T1A4, T2A4, T3A4 corresponding to transistors T1A, T2A, T3A, respectively.

GAA structure 300B includes GAA structures 200B3 and 200B4 used to form circuits 200A3 and 200A4, respectively. GAA structures 200B3 and 200B4 are each similar to GAA structure 200A shown in FIG. 2G. As a result, GAA structure 200B3 and 200B4 each include one ODB region contact elements, two bottom OD regions, two top OD regions, one ODT region contact element, and six nanowires, which, for simplicity, are not labeled. Consequently, GAA structure 300B includes two ODB region contact elements, four bottom OD regions, four top OD regions, two ODT region contact elements, and twelve nanowires. In the above and subsequent illustrations, for simplicity, the number of nanowires is counted as seen by the corresponding cross-section diagram. The exact count of nanowires in a corresponding GAA structure is adjusted accordingly.

As explained with reference to FIG. 2G, when the top OD regions of transistors T1A3 and T2A3 are configured differently, such as when each transistor T1A3 and T2A3 is configured to have a separate top OD region, the number of top OD regions and the number of ODT region contact elements of GAA structure 200B3 change accordingly. Similarly, when the bottom OD regions of transistors T2A3 and T3A3 are configured differently, such as when each transistor T2A3 and T3A3 having a separate bottom OD region, the number of bottom OD regions and the number of ODB region contact elements of GAA structure 200B3 change accordingly. Further, when the top OD regions and/or the bottom OD regions of GAA structure 200B4 are configured differently, the number of top OD regions, the number of ODT region contact elements, the number of bottom OD regions, the number of ODB region contact elements of GAA structure 200B4 change accordingly.

In various embodiments of the present disclosure, regarding two similar circuits, when a GAA structure of the first circuit changes, the GAA structure of the second circuit is configured to change accordingly. For example, if any one of the number of bottom OD regions, of top OD regions, of ODB region contact elements, and/or of ODT region contact elements of the first circuit changes, the second circuit is configured to have the same changes.

FIG. 3C is a diagram of an exemplary circuit 300C, in accordance with some embodiments. FIG. 3D is a cross-section diagram of a GAA structure 300D used to form circuit 300C, in accordance with some embodiments.

Circuit 300C includes circuits 300C1, 300C2, 300C3 coupled in series. Circuit 300C1 includes PMOS transistors T10-1, T10-2. Circuit 300C2 includes PMOS transistors T10-3, T10-4. Circuit 300C3 includes PMOS transistors T10-5, T10-6. Circuit 300C1 is coupled with circuit 300C2 by a conductive line 310_C1_C2 at the source of transistor T10-2 and the source of transistor T10-3. Circuit 300C2 is coupled with circuit 300C3 by a conductive line 310_C2_C3 at the source of transistor T10-4 and the source of transistor T10-5.

In FIG. 3D, GAA structure 300D includes GAA structures 300D1, 300D2, and 300D3 used to form circuits 300C1, 300C2, and 300C3, respectively. Each of GAA structures 300D1, 300D2, and 300D3 includes corresponding ODB region contact elements, bottom OD regions, top OD regions, and nanowires for corresponding transistors T10-1, T10-2, T10-3, T10-4, T10-5, and T10-6, which, for simplicity, are not labeled.

As illustratively shown in FIG. 3D, GAA structures 300D1, 300D2, and 300D3 each include two ODB region contact elements, two bottom OD regions, one top OD region, and four nanowires. Consequently, GAA structure 300D includes six ODB region contact elements, six bottom OD regions, three top OD regions, and twelve nanowires.

When the top OD regions and/or the bottom OD regions of GAA structure 300D are configured differently, the number of top OD regions, the number of ODT region contact elements, the number of bottom OD regions, and the number of ODB region contact elements of GAA structure 300D change accordingly.

Figure 3E:
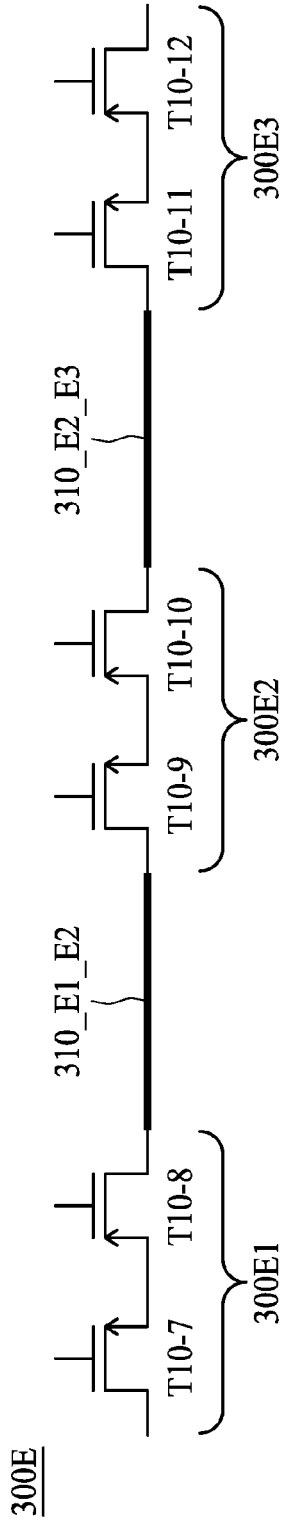
FIGS. 3E-3F are diagrams used to illustrate another exemplary series connection of three circuits, in accordance with some embodiments.
Figure 3F:
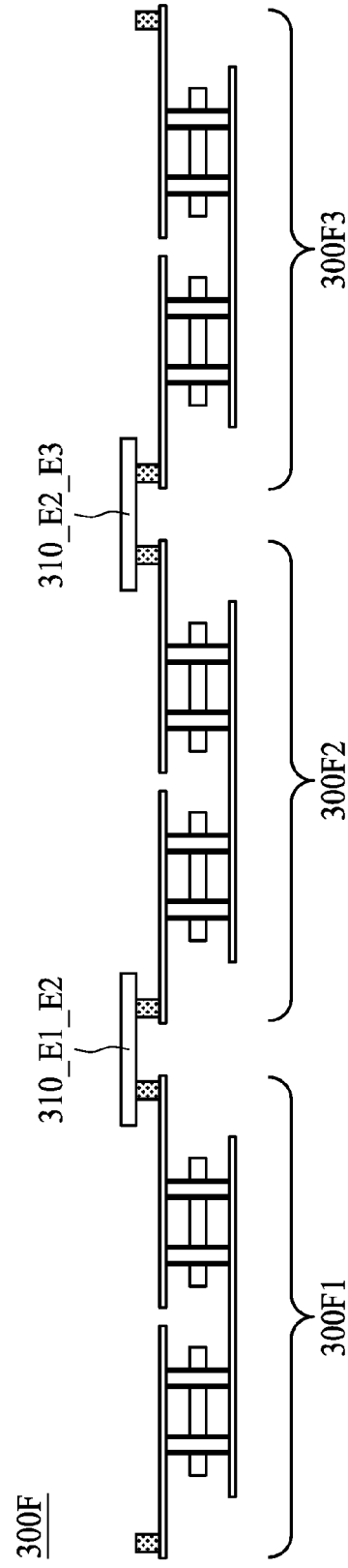

FIG. 3E is a diagram of an exemplary circuit 300E, in accordance with some embodiments. FIG. 3F is a cross-section diagram of a GAA structure 300F used to form circuit 300E, in accordance with some embodiments.

Circuit 300E includes circuits 300E1, 300E2, and 300E3 coupled in series. Circuit 300E1 includes PMOS transistors T10-7, T10-8. Circuit 300E2 includes PMOS transistors T10-9, T10-10. Circuit 300E3 includes PMOS transistors T10-11, T10-12. Circuit 300E1 is coupled with circuit 300E2 by a conductive line 310_E1_E2 at the drain of transistor T10-8 and the drain of transistor T10-9. Circuit 300E2 is coupled with circuit 300E3 by a conductive line 310_E2_E3 at the drain of transistor T10-10 and the drain of transistor T10-11.

In FIG. 3F, GAA structure 300F includes GAA structures 300F1, 300F2, and 300F3 used to form circuits 300E1, 300E2, and 300E3, respectively. Each of GAA structures 300E1, 300E2, and 300E3 includes corresponding ODT region contact elements, bottom OD regions, top OD regions, and nanowires for corresponding transistors T10-7, T10-8, T10-9, T10-10, T10-11, and T10-12, which, for simplicity, are not labeled.

As illustratively shown in FIG. 3F, GAA structures 300F1, 300F2, and 300F3 each include two ODT region contact elements, two top OD regions, one bottom OD region, and four nanowires. Consequently, GAA structure 300F includes six ODT region contact elements, six top OD regions, three bottom OD regions, and twelve nanowires.

When the top OD regions and/or the bottom OD regions of GAA structure 300F are configured differently, the number of top OD regions, the number of ODT region contact elements, the number of bottom OD regions, and the number of ODB region contact elements of GAA structure 300F change accordingly.

FIG. 3G is a diagram of an exemplary circuit 300G, in accordance with some embodiments. FIG. 3H is a diagram of a GAA structure 300H used to form circuit 300G, in accordance with some embodiments.

Circuit 300G includes transistors T10-13, T10-14 coupled in parallel. For illustration, transistors T10-13, T10-14 are each a transistor 100A in FIG. 1A. Transistor T10-13 is coupled with transistor T10-14 by a conductive line 310_S13_S14 at the sources of transistors T10-13 and T10-14. Transistor T10-13 is also coupled with transistor T10-14 by a conductive line 310_D13_D14 at the drains of transistors T10-13 and T10-14.

In FIG. 3H, GAA structure 300H includes GAA structures 300H1, 300H2 used to form transistors T10-13, T10-14, respectively. Because each of transistors T10-13 and T10-14 is a transistor 100A, each of GAA structures 300H1 and 300H2 corresponds to a GAA structure 100D in FIG. 1D. For simplicity, however, bulk BK_B10 in FIG. 1D is not shown in FIG. 3H. Each of GAA structures 300H1, 300H2 includes corresponding ODB region contact elements, bottom OD regions, top OD regions, and nanowires for corresponding transistors T10-13, T10-14, which, for simplicity, are not labeled.

As illustratively shown in FIG. 3H, GAA structures 300H1, 300H2 each include one ODT region contact element, one top OD region, one bottom OD region, one ODB region contact element, and two nanowires. Consequently, GAA structure 300H includes two ODT region contact elements, two top OD regions, two bottom OD regions, two ODB region contact elements, and four nanowires.

In FIG. 3G, the source of transistors T10-13 is coupled with the source of transistor T10-14 through conductive line 310_S13_S14 and for illustration, in FIG. 3H, two ODB region contact elements are coupled with corresponding ODB regions. Other ways to couple the source of transistor T10-13 and the source of transistor T10-14 are within the contemplated scope of the present disclosure. For example, in some embodiments, the sources of transistors T10-13 and T10-14 are formed by a same bottom OD region. In such a situation, ODB region contact elements for corresponding bottom OD regions are not used.

Other ways to couple the drain of transistor T10-13 and the drain of transistor T10-14 are within the contemplated scope of the present disclosure. For example, in some embodiments, the drains of transistors T10-13 and T10-14 are formed by a same top OD region. In such a situation, ODT region contact elements for corresponding top OD regions are not used.

When the top OD regions and/or the bottom OD regions of GAA structure 300H are configured differently, the number of top OD regions, the number of ODT region contact elements, the number of bottom OD regions, the number of ODB region contact elements of GAA structure 300H change accordingly.

Layout Orientation Considerations

Figure 4A:
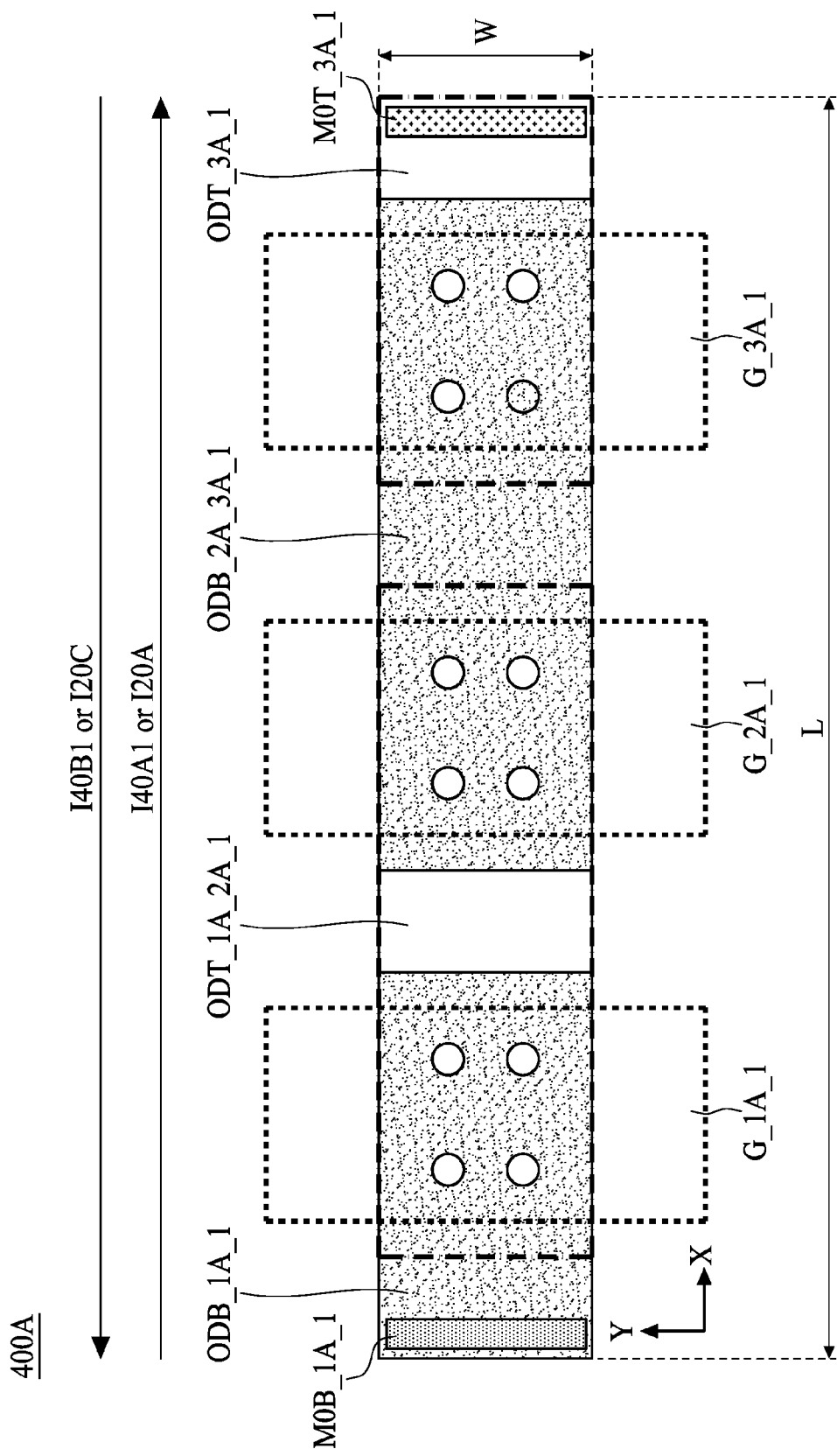
FIGS. 4A-4D are diagrams used to illustrate directions or orientations of layout diagrams of exemplary circuits in FIGS. 2A and 2C, in accordance with some embodiments.

FIG. 4A is a layout diagram of a GAA structure 400A corresponding to the cross-section diagram in FIG. 2G and circuit 200A in FIG. 2A.

In FIG. 4A, a length L of structure 400A is in the X direction, and a width W of structure 400A is in the Y direction. Structure 400A is called to be in a horizontal direction because length L of structure 400A is in the X direction. ODB region contact element M0B_1A_1, bottom OD regions ODB_1A_1 and ODB_2A_3A_1, top OD regions ODT_1A_2A_1 and ODT_3A_1, ODT region contact element M0T_3A_1 and gate regions G_1A_1, G_2A_1 and G_3A_1 correspond to the corresponding ODB region contact element M0B_1A, bottom OD regions ODB_1A and ODB_2A_3A, top OD regions ODT_1A_2A and ODT_3A, ODT region contact element M0T_3A and gate regions G_1A, G_2A and G_3A in FIG. 2G. For illustration, a current I40A1 flows from ODB region contact element M0B_1A_1 to ODT region contact element M0T_3A_1. Effectively, current I40A1 is the same as current I20A in FIG. 2B. Further, a current I40A2 flows from ODT region contact element M0T_3A_1 to ODB region contact element M0B_1A_1. Effectively, current I40B1 is the same as current I20C in FIG. 2D.

Figure 4B:
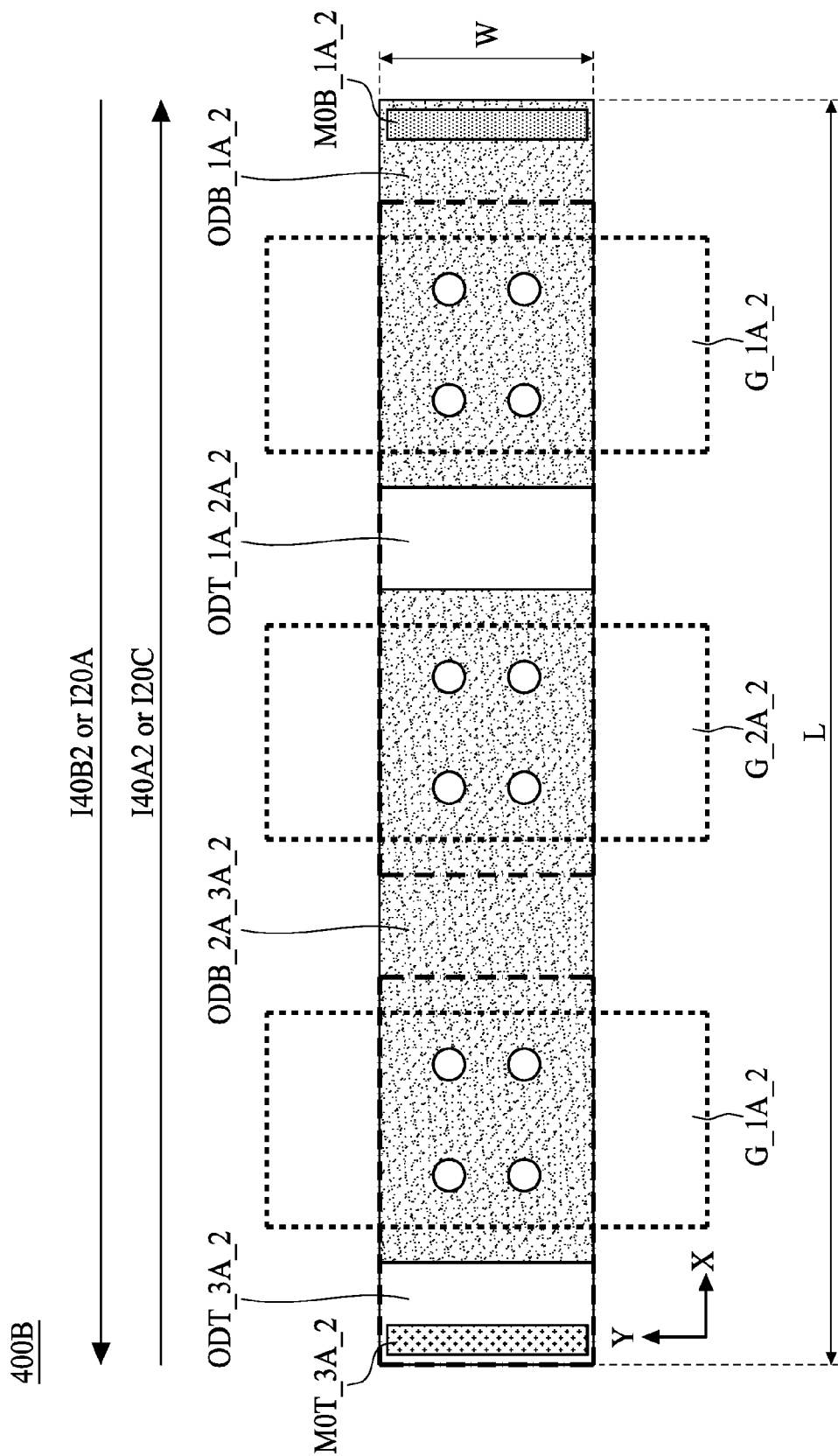

In FIG. 4B, structure 400B is also in the X direction. ODB region contact element M0B_1A_2, bottom OD regions ODB_1A_2 and ODB_2A_3A_2, top OD regions ODT_1A_2A_2 and ODT_3A_2, ODT region contact element M0T_3A_2 and gate regions G_1A_2, G_2A_2 and G_3A_2 correspond to the corresponding ODB region contact element M0B_1A, bottom OD regions ODB_1A and ODB_2A_3A, top OD regions ODT_1A_2A and ODT_3A, ODT region contact element M0T_3A and gate regions G_1A, G_2A and G_3A in FIG. 2G. For illustration, a current I40A2 flows from ODT region contact element M0T_3A_2 to ODB region contact element M0B_1A_2. Effectively, current I40A2 is the same as current I20C in FIG. 2D. Further, a current I40B2 flows from ODB region contact element M0B_1A_2 to ODT region contact element M0T_3A_2. Effectively, current I40B2 is the same as current I20A in FIG. 2B. For illustration, structure 400A in FIG. 4A is called to be in an X1 direction (not labeled) while structure 400B in FIG. 4B is in an X2 direction (not labeled) opposite to the X1 direction.

Figure 4C:
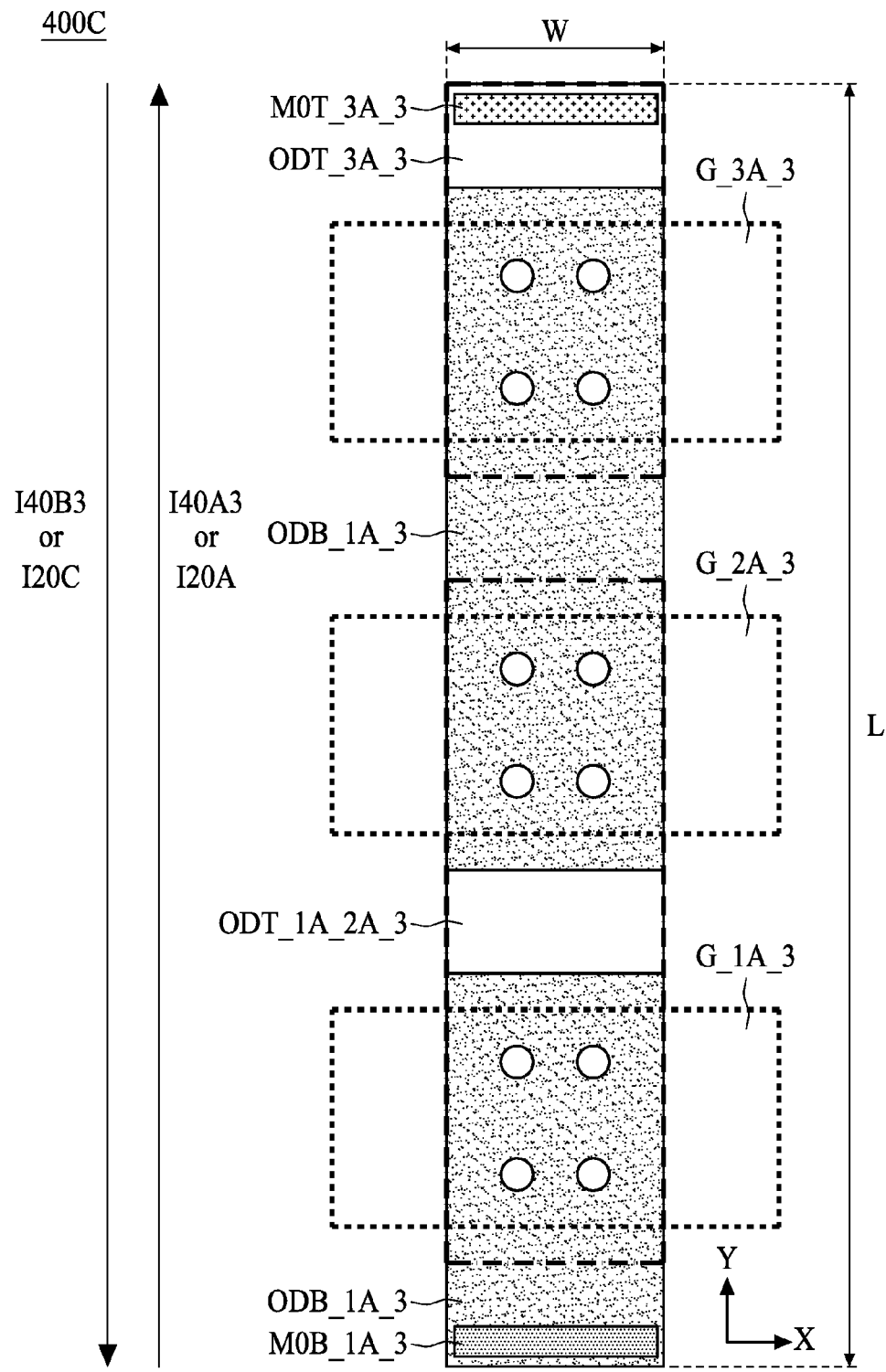
Figure 4D:
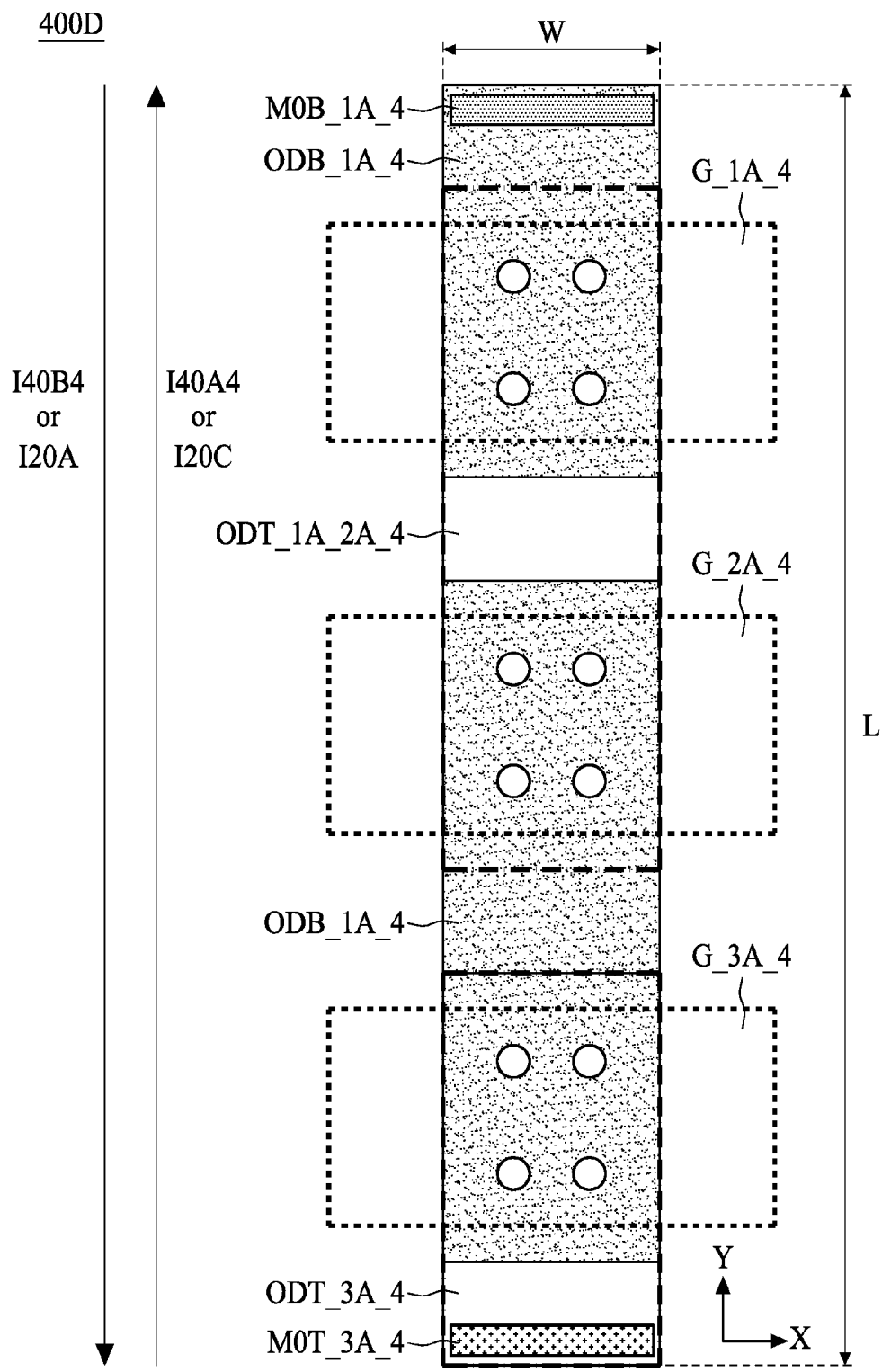

In each of FIGS. 4C and 4D, structure 400C or 400D is in a vertical direction. For FIG. 4C, ODB region contact element M0B_1A_3, bottom OD regions ODB_1A_3 and ODB_2A_3A_3, top OD regions ODT_1A_2A_3 and ODT_3A_3, ODT region contact element M0T_3A_3 and gate regions G_1A_3, G_2A_3 and G_3A_3 correspond to the corresponding ODB region contact element M0B_1A, bottom OD regions ODB_1A and ODB_2A_3A, top OD regions ODT_1A_2A and ODT_3A, ODT region contact element M0T_3A and gate regions G_1A, G_2A and G_3A in FIG. 2G. For FIG. 4D, ODB region contact element M0B_1A_4, bottom OD regions ODB_1A_4 and ODB_2A_3A_4, top OD regions ODT_1A_2A_4 and ODT_3A_4, ODT region contact element M0T_3A_4 and gate regions G_1A_4, G_2A_4 and G_3A_4 correspond to the corresponding ODB region contact element M0B_1A, bottom OD regions ODB_1A and ODB_2A_3A, top OD regions ODT_1A_2A and ODT_3A, ODT region contact element M0T_3A and gate regions G_1A, G_2A and G_3A in FIG. 2G. For illustration, structure 400C in FIG. 4C called to be in an Y1 direction (not labeled) while structure 400D in FIG. 4D is in an Y2 direction (not labeled) opposite to the Y1 direction. For illustration, in FIG. 4C a current I40A3 flows from ODB region contact element M0B_1A_3 to ODT region contact element M0T_3A_3. Effectively, current I40A3 is the same as current I20A in FIG. 2B. Further, a current I40B3 flows from ODT region contact element M0T_3A_3 to ODB region contact element M0B_1A_3. Effectively, current I40B3 is the same as current I20C in FIG. 2D. In FIG. 4D, a current I40B4 flows from ODB region contact element M0B_1A_4 to ODT region contact element M0T_3A_4. Effectively, current I40B4 is the same as current I20A in FIG. 2B. Further, a current I40A4 flows from ODT region contact element M0T_3A_4 to ODB region contact element M0B_1A_4. Effectively, current I40A4 is the same as current I20C in FIG. 2D.

In various embodiments regarding a first circuit similar to a second circuit, regardless of the layout direction or orientation of the corresponding GAA structures, the first circuit and the second circuits are configured to have the same current flowing through corresponding circuit elements of corresponding GAA structures. For illustration, the first circuit has a GAA structure in the X1 direction and has current I40A1. In accordance with various embodiments of the present disclosure, the second circuit can be configured in different ways so that the first circuit and the second circuit perform in a substantially the same manner. Exemplary configurations of the second circuit include 1) the second circuit is configured to have a GAA structure in the X1 direction and to have current I40A1 b) the second circuit is configured to have a GAA structure in the X2 direction and to have current I40B2 c) the second circuit is configured to have the GAA structure in the Y1 direction and to have current I40A3 or d) the second circuit is configured to have the GAA in the Y2 direction and to have current I40B4. In some embodiments, the term "substantially the same" for a first layout orientation and a second layout orientation refers to the first layout orientation being substantially parallel or substantially orthogonal to the second layout orientation. In some embodiments, the term "substantially the same" for a first current direction and a second current direction refers to an absolute value of an a current through the first circuit along the first current direction being substantially the same as an absolute value of a current through the second circuit along the second direction.

Nano Wire Considerations

Figure 5A:
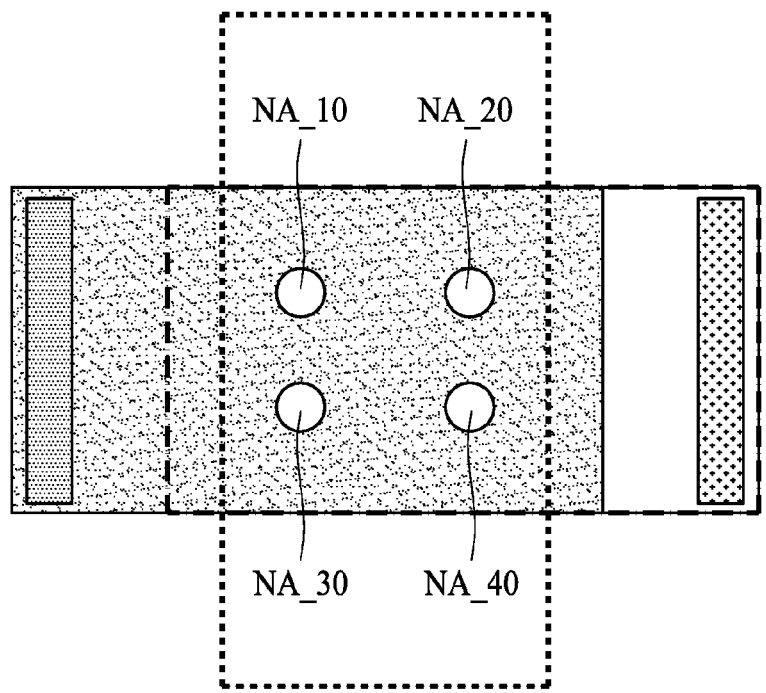
FIGS. 5A-5C are diagrams used to illustrate a number of rows of nanowires in an array, a number of nanowires in a row, a number of column of nanowires in the array, a number of nanowires in a column, and a number of nanowires in the array, in accordance with some embodiments.

FIG. 5A is the layout diagram of GAA structure 100C in FIG. 1C reproduced for further illustrations and having labels related to nanowires NA_10, NA_20, NA_30, and NA_40. As illustratively shown, nanowires NA_10, NA_20, NA_30, NA_40 are arranged in an array of two rows and two columns.

Figure 5B:
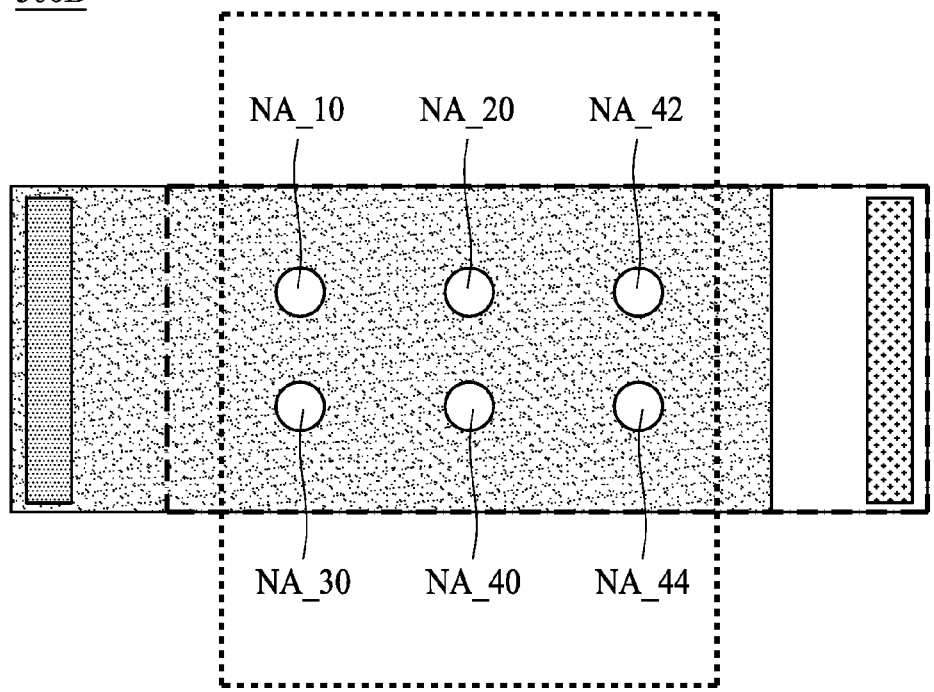

FIG. 5B is a layout diagram of a GAA structure 500B, in accordance with some embodiments. Compared with GAA structure 100C in FIG. 5A, GAA structure 500B includes two additional nanowires NA_42 and NA_44. Effectively, GAA structure 500B includes an array of nanowires, having two rows and three columns.

Figure 5C:
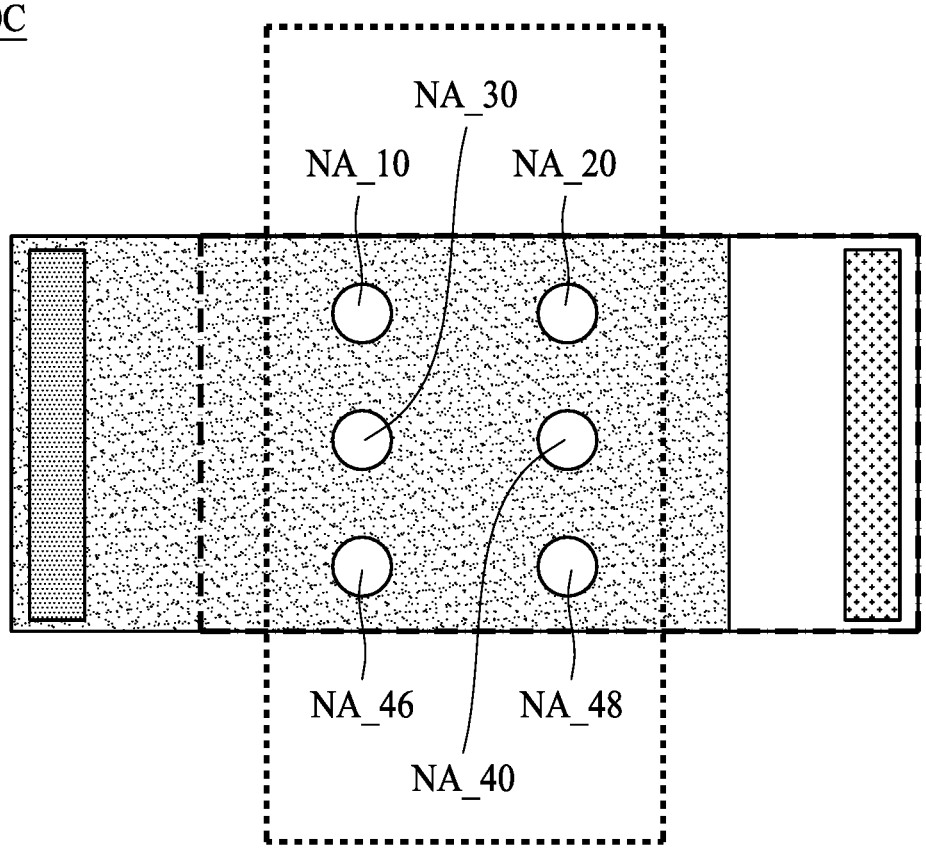

FIG. 5C is a layout diagram of a GAA structure 500C, in accordance with some embodiments. Compared with GAA structure 100C in FIG. 5A, GAA structure 500C includes two additional nanowires NA_46 and NA_48. Effectively, GAA structure 500C includes an array of nanowires, having three rows and two columns.

FIGS. 5D-1 to 5H-3 are diagrams of different shapes of nanowires between the top OD region OD_T10 and bottom OD region OD_B10, in accordance with some embodiments.

FIG. 5D-1 is a perspective diagram of nanowires NA_10_1, NA_20_1, NA_30_1 and NA_40_1 having a circular horizontal cross section and a continuously tapered vertical cross section, in accordance with some embodiments. FIG. 5D-2 is a cross-section diagram at line CC" in FIG. 5D-1, in accordance with some embodiments. FIG. 5D-3 is a cross-section diagram at line DD" in FIG. 5D-1, in accordance with some embodiments. In FIG. 5D-1, the nanowires NA_10_1, NA_20_1, NA_30_1 and NA_40_1 correspond to the nanowires NA_10, NA_20, NA_30 and NA_40 in FIG. 1B but with different shapes. The horizontal cross section of the nanowire NA_10_1, NA_20_1, NA_30_1 or NA_40_1 at line CC" has a circular shape, as illustratively shown in FIG. 5D-2. The vertical cross section of the nanowire NA_10_1 or NA_20_1 at line DD" has a continuously tapered shape that is gradually narrowed from the bottom OD region OD_B10 towards the top OD region OD_T10, as illustratively shown in FIG. 5D-3. Therefore, in FIG. 5D-3, the vertical cross section of the nanowire NA_10_1 or NA_20_1 is asymmetrical with respect to a middle line 510_1 between opposite ends of the nanowire NA_10_1, or NA_20_1 connected to the corresponding top OD region OD_T10 and bottom OD region OD_B10.

FIG. 5E-1 is a perspective diagram of nanowires NA_10_2 and NA_20_2, having a rectangular horizontal cross section and a continuously tapered vertical cross section and arranged in a row, in accordance with some embodiments. FIG. 5E-2 is a cross-section diagram at line EE" in FIG. 5E-1, in accordance with some embodiments. FIG. 5E-3 is a cross-section diagram at line FF" in FIG. 5E-1, in accordance with some embodiments. In FIG. 5E-1, the nanowires NA_10_2 and NA_20_2 correspond to the nanowires NA_10, NA_20, NA_30 and NA_40 in FIG. 1B but with different shapes and are different in numbers. The horizontal cross section of the nanowire NA_10_2 or NA_20_2 at line EE" has a rectangular shape, as illustratively shown in FIG. 5E-2. In addition, in FIG. 5E-2, two nanowires NA_10_2 and NA_20_2 are arranged in a row. The vertical cross section of the nanowire NA_20_2 at line FF" has a continuously tapered shape that is gradually narrowed from the bottom OD region OD_B10 towards the top OD region OD_T10, as illustratively shown in FIG. 5E-3. Therefore, in FIG. 5E-3, the vertical cross section of the nanowire NA_20_2 is asymmetrical with respect to a middle line 510_2 between opposite ends of the nanowire NA_20_2 connected to the corresponding top OD region OD_T10 and bottom OD region OD_B10.

FIG. 5F-1 is a perspective diagram of nanowires NA_10_3 and NA_20_3, having a rectangular horizontal cross section and a continuously tapered vertical cross section and arranged in a column, in accordance with some embodiments. FIG. 5F-2 is a cross-section diagram at line GG" in FIG. 5E-1, in accordance with some embodiments. FIG. 5F-3 is a cross-section diagram at line HH" in FIG. 5F-1, in accordance with some embodiments. In FIG. 5F-1, the nanowires NA_10_3 and NA_20_3 correspond to the nanowires NA_10, NA_20, NA_30 and NA_40 in FIG. 1B but with different shapes and are different in numbers. The horizontal cross section of the nanowire NA_10_3 or NA_20_3 at line EE" has a rectangular shape, as illustratively shown in FIG. 5F-2. In addition, in FIG. 5F-2, two nanowires NA_10_3 and NA_20_3 are arranged in a column. The vertical cross section of the nanowire NA_10_3 at line HH" has a continuously tapered shape that is gradually narrowed from the bottom OD region OD_B10 towards the top OD region OD_T10, as illustratively shown in FIG. 5F-3. Therefore, in FIG. 5F-3, the vertical cross section of the nanowire NA_10_3 is asymmetrical with respect to a middle line 510_3 between opposite ends of the nanowire NA_10_3 connected to the corresponding top OD region OD_T10 and bottom OD region OD_B10.

FIG. 5G-1 is a perspective diagram of nanowires NA_10_4 and NA_20_4, having a rectangular horizontal cross section and a stepwise tapered vertical cross section and arranged in a row, in accordance with some embodiments. FIG. 5G-2 is a cross-section diagram at line II" in FIG. 5G-1, in accordance with some embodiments. FIG. 5G-3 is a cross-section diagram at line JJ" in FIG. 5G-1, in accordance with some embodiments. In FIG. 5G-1, the nanowires NA_10_4 and NA_20_4 correspond to the nanowires NA_10, NA_20, NA_30 and NA_40 in FIG. 1B but with different shapes and are different in numbers. The horizontal cross section of the nanowire NA_10_4 or NA_20_4 at line II" has a rectangular shape, as illustratively shown in FIG. 5G-2. In addition, in FIG. 5G-2, two nanowires NA_10_4 and NA_20_4 are arranged in a row. The vertical cross section of the nanowire NA_10_3 at line JJ" has a stepwise tapered shape that is narrowed in steps from the bottom OD region OD_B10 towards the top OD region OD_T10, as illustratively shown in FIG. 5G-3. Therefore, in FIG. 5G-3, the vertical cross section of the nanowire NA_20_4 is asymmetrical with respect to a middle line 510_4 between opposite ends of the nanowire NA_20_4 connected to the corresponding top OD region OD_T10 and bottom OD region OD_B10.

FIG. 5H-1 is a perspective diagram of nanowires NA_10_5 and NA_20_5, having a rectangular horizontal cross section and a stepwise tapered vertical cross section and arranged in a row, in accordance with some embodiments. FIG. 5H-2 is a cross-section diagram at line KK" in FIG. 5H-1, in accordance with some embodiments. FIG. 5H-3 is a cross-section diagram at line LL" in FIG. 5H-1, in accordance with some embodiments. In FIG. 5H-1, the nanowires NA_10_5 and NA_20_5 correspond to the nanowires NA_10, NA_20, NA_30 and NA_40 in FIG. 1B but with different shapes and are different in numbers. The horizontal cross section of the nanowire NA_10_5 or NA_20_5 at line KK" has a rectangular shape, as illustratively shown in FIG. 5H-2. In addition, in FIG. 5H-2, two nanowires NA_10_5 and NA_20_5 are arranged in a column. The vertical cross section of the nanowire NA_10_5 at line KK" has a stepwise tapered shape that is narrowed in steps from the bottom OD region OD_B10 towards the top OD region OD_T10, as illustratively shown in FIG. 5H-3. Therefore, in FIG. 5H-3, the vertical cross section of the nanowire NA_10_5 is asymmetrical with respect to a line 510_5 between opposite ends of the nanowire NA_10_5 connected to the corresponding top OD region OD_T10 and bottom OD region OD_B10.

In the above FIGS. 5D-1 to 5D-3, 5E-1 to 5E-3, 5F-1 to 5F-3, 5G-1 to 5G-3, and 5H-1 to 5H-3, based on the asymmetrical shapes of the nanowires, absolute values of currents in opposite directions are different. For example, a first absolute current value of a first current in a first current path through the nanowires from a top OD region to a bottom OD region is different from a second absolute current value of a second current in a second current path through the nanowires from the bottom region to the top region. In various embodiments of the present disclosure, even if the nanowires are asymmetrical, they are considered to be substantially symmetrical if the absolute currents in opposite directions have substantially the same absolute values. In some embodiments, whether two absolute values are substantially the same is predetermined.

Different shapes, sizes and configurations of nanowires including those of nanowires illustratively shown in FIGS. 5D-1 to 5H-3 are within the contemplated scope of the present disclosure. Different exemplary shapes of a horizontal cross section of nanowire include a rectangle with rounded corners, an ellipse, etc. Different exemplary shapes of a vertical cross section of nanowire include a stepwise tapered shape with number of steps other than two. Different exemplary sizes of a nanowire include different diameters of a circular horizontal cross section of the nanowire and different widths or lengths of a rectangular horizontal cross section of the nanowire. Different exemplary configurations of nanowires include different number of nanowires in an array, different number of nanowires in a row, different number of nanowires in a column, different number of rows of nanowires and different number of columns of nanowires.

In various embodiments of the present disclosure, a number of rows of nanowires, a number of nanowires in a row, a number of columns of nanowires, a number of nanowires in a column, a number of total nanowires of transistors, and/or shape of the nanowires are considered in configuring two similar circuits. For example, in some embodiments regarding a first circuit similar to a second circuit, a number of rows of nanowires, a number of nanowires in a row, a number of columns of nanowires, a number of nanowires in a column, a total number of nanowires in the first circuit, and/or shape of the nanowires are each configured to be substantially the same as those of the second circuit. For another example, the first circuit and the second circuit each include two rows and three columns of nanowires for a total of six nanowires. For yet another example, the first circuit and the second circuit each include three rows and two columns of nanowires for a total of six nanowires, etc. Two rows and three columns of nanowires in FIG. 5B and three rows and two columns of nanowires in FIG. 5C are used for illustration. Another number of rows and/or columns is within the contemplated scope of the present disclosure. In some embodiments, the term "substantially the same" for a shape of a first nanowire and a shape of a second nanowire refers to values of shape-related physical parameters of the first nanowire that affect an absolute current through the first nanowire being substantially the same as those of the second nanowire. In other embodiments, the first circuit is similar to a second circuit when an absolute value of a current of each nanowire in the first circuit is substantially the same as an absolute value of a current of each nanowire in the second circuit regardless of the shapes of the nanowires in the first circuit and the second circuit.

Additional Similar Circuits and GAA Structure Configurations

Figure 6A:
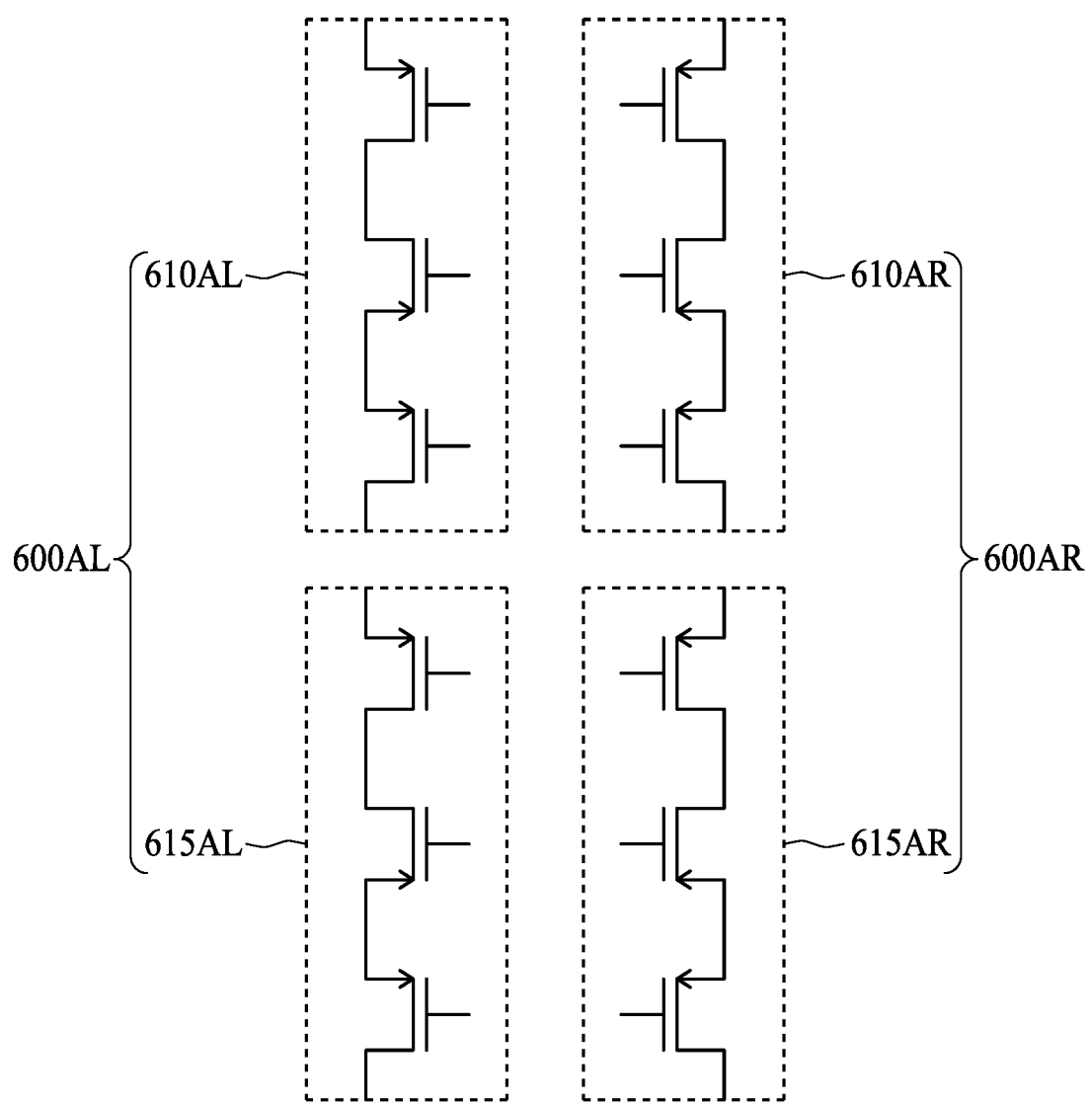
FIGS. 6A-6C are diagrams of exemplary circuits that can use inventive concepts of various embodiments of the present disclosure.

FIG. 6A is diagrams of exemplary similar circuits 600A, in accordance with some embodiments. For example, circuits 610AL and 610AR are similar. Circuits 615AL and 615AR are similar. Each of circuit 615AL, 615AR is the same as corresponding circuits 610AL, 610AR, and are for illustration, but, in various embodiments, can be different from corresponding circuits 610AL, 610AR. For simplicity, details of circuits 610AL, 610AR, 615AL, and 615AR are not labeled.

As explained above, each of circuit 610AL, 610AR may be formed using different GAA structures, resulting a situation that GAA structures of each circuit 610AL, 610AR, 615AL, 615AR has a distinct number of ODT region contact elements, top OD regions, ODB region contact elements, bottom OD regions, current paths from a bottom OD region to a top OD region, current paths from a top OD region to a bottom OD region etc. Each of circuit 610AL, 610AR, 615AL, 615AR may have a distinct nanowire structure, e.g., having a different number of rows and columns of nanowires in an array of nanowires, different shapes and sizes of nanowires, etc.

In various embodiments of the present disclosure, GAA structures for corresponding circuit 610AL and 610AR are configured to have substantially the same of at least one of the following features: a number of current paths flowing from a top OD region to a bottom OD region, a number of current paths flowing from a bottom OD region to a top OD region, a number of bottom OD regions, a bottom OD layout orientation, a number of top OD regions, a top OD layout orientation, a number of ODB region contact elements, a layout orientation of the ODB region contact elements, a number of ODT region contact elements, a layout orientation of the ODT region contact elements, a number of nanowires in an array, a number of rows of nanowires in the array, a number of nanowires in an row, a number of columns of nanowires in the array, a number of nanowires in an column, a shape of nanowires, etc.

In various embodiments, GAA of circuit 610AL is combined with another circuit, such as circuit 615AL, resulting in circuit 600AL, for example. The combined circuit 600AL has a corresponding GAA structure. Similarly, circuit 610AR is combined with a circuit, resulting in circuit 600AR, for example. In various embodiments, the GAA structure of circuit 600AR is configured such that GAA structures of circuits 600AL and 600AR have substantially the same of at least one of the features explained with reference to circuits 610AL and 610AR.

In various embodiments, the GAA structures of circuits 610AL and 615AL are combined in many different ways, including parallel, in series, and/or combinations thereof, for example. Further, each of a GAA structure of a sub-circuit, such as a transistor in circuit 615AL, is coupled in series, in parallel, and or a combination thereof with one or a combination of a GAA structure of a sub-circuit in circuit 610AL, including one or more transistors in circuit 610AL, for another example. In some embodiments, GAA structure 600AR, which is the GAA combination result of circuits 610AR and 615AR is configured to have substantially the same of at least one of the features of the GAA structure of circuit 600AL.

Figure 6B:
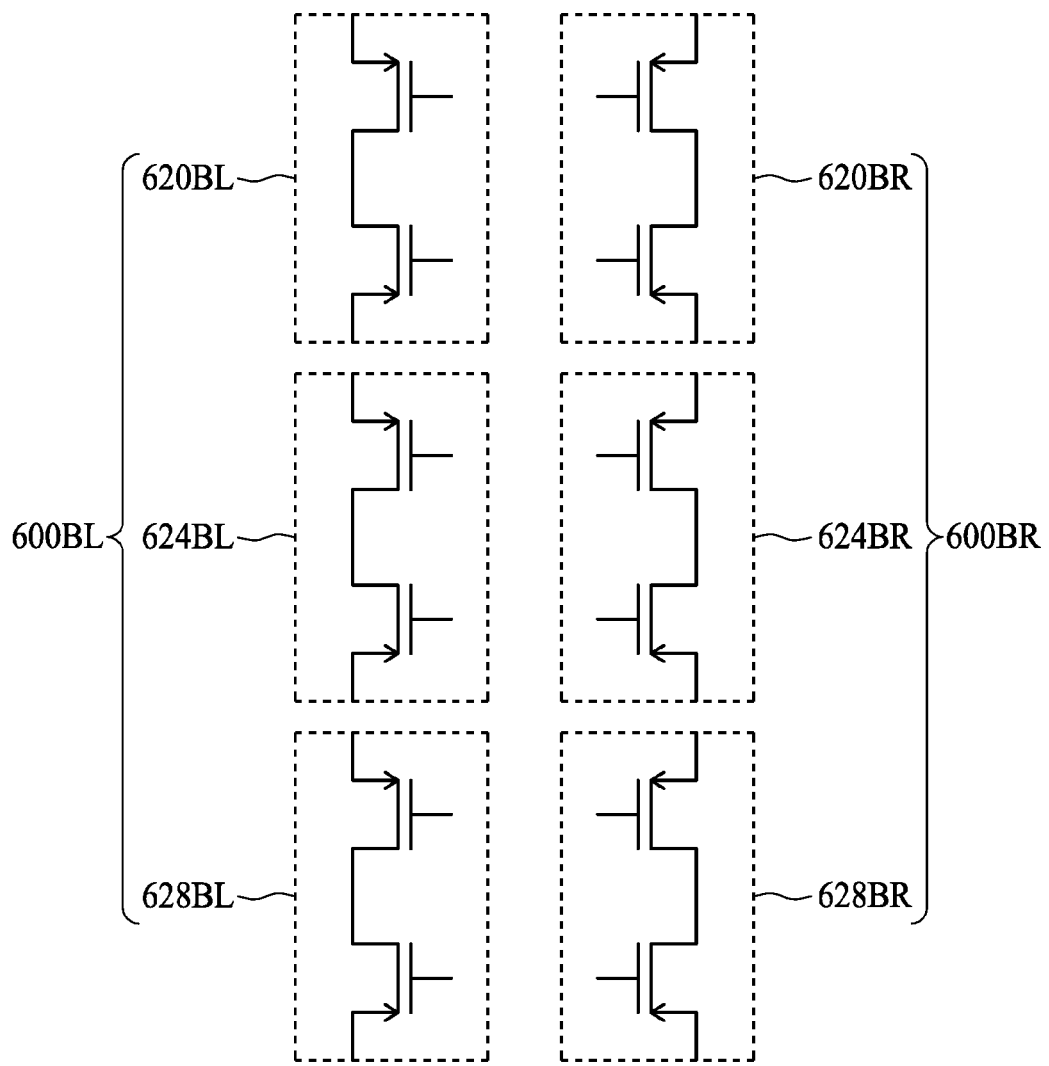

FIG. 6B is diagrams of other exemplary similar circuits 600B, in accordance with some embodiments. For illustration, each of circuits labeled with an 'L" is similar to corresponding circuits labeled with an "R." For simplicity, details of circuits in FIG. 6B are not labeled. In various embodiments of the disclosure, GAA structures of circuits with label "L" corresponding to circuits with label "R" are configured to have substantially the same of at least one of the features described throughout this document. Further, GAA structures of one or more of a circuit with label "L" may be combined. In various embodiments, GAA structures of one or more of a corresponding circuit with label "R" are also combined such that the resulting GAA structures of "L" circuits and "R" circuits have substantially the same of at least one of the features described in this document.

Figure 6C:
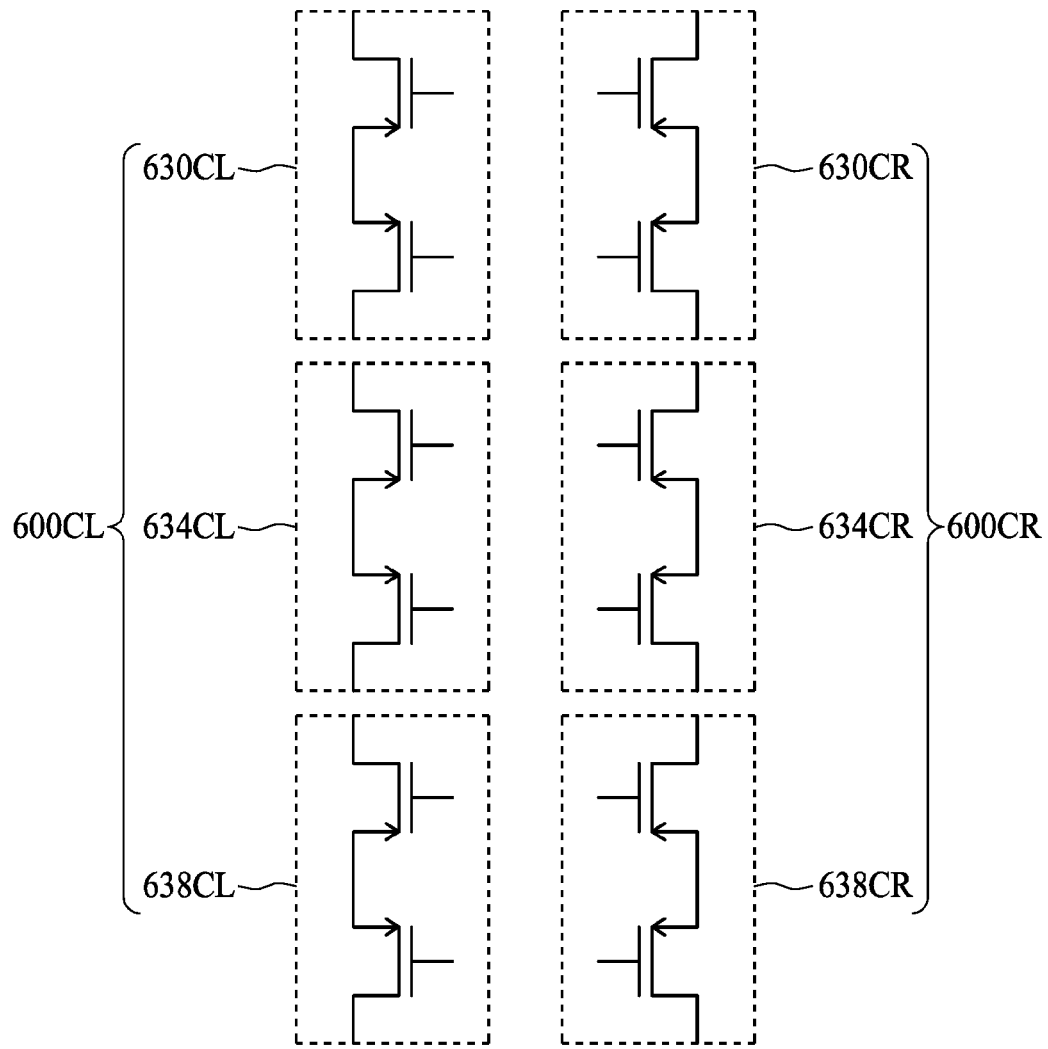

FIG. 6C is diagrams of other exemplary similar circuits, in accordance with some embodiments. For simplicity, details of circuits in FIG. 6C are not labeled. Similarly to circuits in FIG. 6B, in various embodiments of the disclosure, GAA structures of circuits with label "L" corresponding to circuits with label "R" in FIG. 6C are configured to have substantially the same of at least one of the features described throughout this document. Further, GAA structures of one or more of a circuit with label "L" may be combined. In various embodiments, GAA structures of one or more of a corresponding circuit with label "R" are also combined such that the resulting GAA structures of "L" circuits and "R" circuits have substantially the same of at least one of the features described in this document.

In some embodiments, a semiconductor structure includes a first gate-all-around (GAA) structure and a second GAA structure. The first GAA structure is configured to form a first circuit. The second GAA structure is configured to form a second circuit similar to the first circuit. At least one of the first GAA structure or the second GAA structure includes at least one GAA device. A GAA device of the at least one GAA device includes a corresponding number of at least one nanowire and a gate region. A first nanowire of the at least one nanowire has a first cross-section taken along a first direction that is asymmetrical with respect to a middle line of the first cross-section. The middle line has a second direction substantially orthogonal to the first direction. The first cross-section has a first end line and a second end line substantially parallel the middle line. The first end line is shorter than the second end line. The gate region wraps all around a corresponding portion of the first nanowire of the at least one nanowire. The first GAA structure and the second GAA structure have substantially a same of at least one of the following features: a number of GAA devices in the at least one GAA device configured to have current flow from the first end line of the first cross-section to the second end line of the first cross-section; a number of GAA devices in the at least one GAA device configured to have current flow from the second end line of the first cross-section to the first end line of the first cross-section; an order of directions of current flow through the first nanowire of the at least one GAA device; a number of the at least one nanowire for a pair of corresponding GAA devices of the first GAA structure and the second GAA structure; a number of rows of the at least one nanowire arranged in an array for a pair of corresponding GAA devices of the first GAA structure and the second GAA structure; a number of nanowires in a row of the at least one nanowire arranged in the array for a pair of corresponding GAA devices of the first GAA structure and the second GAA structure; a number of columns of the at least one nanowire arranged in the array for a pair of corresponding GAA devices of the first GAA structure and the second GAA structure; a number of nanowires in a column of the at least one nanowire arranged in the array for a pair of corresponding GAA devices of the first GAA structure and the second GAA structure; or a shape of the first nanowire for a pair of corresponding GAA devices of the first GAA structure and the second GAA structure.

In some embodiments, a semiconductor structure, includes a first gate-all-around (GAA) and a second GAA structure. The first GAA structure is configured to form a first circuit. The second GAA structure is configured to form a second circuit similar to the first circuit. At least one of the first GAA structure or the second GAA structure includes at least one GAA device. At least one of a first GAA device at one end of the at least one GAA device or a second GAA device at the other end of the at least one GAA device includes a corresponding number of at least one nanowire and a gate region. A first nanowire of the at least one nanowire has a first cross-section taken along a first direction that is asymmetrical with respect to a middle line of the first cross-section. The middle line has a second direction substantially orthogonal to the first direction. The first cross-section has a first end line and a second end line substantially parallel the middle line. The first end line is shorter than the second end line. The gate region wraps all around a corresponding portion of the first nanowire of the at least one nanowire. The first GAA structure and the second GAA structure are configured in one of the following ways: if a first current path through the first GAA structure starts from the first end line of the first GAA device and ends with the second end line of the second GAA device, a second current path through the second GAA structure starts from the first end line of the first GAA device and ends with the second end line of the second GAA device; and if the first current path starts from the second end line of the first GAA device and ends with the first end line of the second GAA device, the second current path starts from the second end line of the first GAA device and ends with the first end line of the second GAA device.

In some embodiments, a semiconductor structure, includes a first GAA structure and a second GAA structure. The first GAA structure is configured to form a first circuit. The second GAA structure is configured to form a second circuit similar to the first circuit. At least one of the first GAA structure or the second GAA structure includes at least one GAA device. A GAA device of the at least one GAA device includes a corresponding number of at least one nanowire, a gate region, and a first oxide diffusion (OD) region and a second OD region. The gate region wraps all around a corresponding portion of a first nanowire of the at least one nanowire. The first OD region and a second OD region are connected to a first end and a second end of the first nanowire of the at least one nanowire. The first end and the second end are on corresponding opposite sides of the portion of the first nanowire wrapped all around by the gate region. The first nanowire has a first cross-sectional area and a second cross-sectional area at the corresponding first end and second end. The first cross-sectional area being smaller than the second cross-sectional area. The first GAA structure and the second GAA structure have substantially a same of at least one of the following features: a number of GAA devices in the at least one GAA device configured to have current flow from the first end to the second end; a number of GAA devices in the at least one GAA device configured to have current flow from the second end to the first end; an order of directions of current flow through the first nanowire of the at least one GAA device; a number of the at least one nanowire for a pair of corresponding GAA devices of the first GAA structure and the second GAA structure; a number of rows of the at least one nanowire arranged in an array for a pair of corresponding GAA devices of the first GAA structure and the second GAA structure; a number of nanowires in a row of the at least one nanowire arranged in the array for a pair of corresponding GAA devices of the first GAA structure and the second GAA structure; a number of columns of the at least one nanowire arranged in the array for a pair of corresponding GAA devices of the first GAA structure and the second GAA structure; a number of nanowires in a column of the at least one nanowire arranged in the array for a pair of corresponding GAA devices of the first GAA structure and the second GAA structure; or a shape of the first nanowire for a pair of corresponding GAA devices of the first GAA structure and the second GAA structure.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. In various embodiments, a source of a transistor can be configured as a drain, and a drain can be configured as a source.

In the illustrative Figures, the sources and/or drains of two transistors being shown coupled in particular way are for illustration. Different ways to couple the sources of two transistors together, to couple the drains of two transistors together, or to couple a drain of a transistor to an source of another transistors are within the contemplated scope of the present disclosure.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:
1. A semiconductor structure, comprising:
a first gate-all-around (GAA) structure configured to form a first circuit; and
a second GAA structure configured to form a second circuit similar to the first circuit;
wherein
at least one of the first GAA structure or the second GAA structure comprises:
at least one GAA device, a GAA device of the at least one GAA device comprising:
a corresponding number of at least one nanowire;
a first nanowire of the at least one nanowire having a first cross-section taken along a first direction that is asymmetrical with respect to a middle line of the first cross-section;
the middle line having a second direction substantially orthogonal to the first direction;
the first cross-section having a first end line and a second end line substantially parallel the middle line; and
the first end line being shorter than the second end line; and
a gate region wrapping all around a corresponding portion of the first nanowire of the at least one nanowire; and
the first GAA structure and the second GAA structure have substantially a same of at least one of the following features:
a number of GAA devices in the at least one GAA device configured to have current flow from the first end line of the first cross-section to the second end line of the first cross-section;
a number of GAA devices in the at least one GAA device configured to have current flow from the second end line of the first cross-section to the first end line of the first cross-section;
an order of directions of current flow through the first nanowire of the at least one GAA device;
a number of the at least one nanowire for a pair of corresponding GAA devices of the first GAA structure and the second GAA structure;
a number of rows of the at least one nanowire arranged in an array for a pair of corresponding GAA devices of the first GAA structure and the second GAA structure;
a number of nanowires in a row of the at least one nanowire arranged in the array for a pair of corresponding GAA devices of the first GAA structure and the second GAA structure;

a number of columns of the at least one nanowire arranged in the array for a pair of corresponding GAA devices of the first GAA structure and the second GAA structure;
a number of nanowires in a column of the at least one nanowire arranged in the array for a pair of corresponding GAA devices of the first GAA structure and the second GAA structure; or
a shape of the first nanowire for a pair of corresponding GAA devices of the first GAA structure and the second GAA structure; and
wherein
the order of directions of current flow of at least one of the first GAA structure or the second GAA structure is arranged along a third direction of current flow along a length of the at least one GAA device;
the order of directions of current flow at least one of the first GAA structure or the second GAA structure is arranged along a fourth direction opposite the third direction;
the order of directions of current flow of at least one of the first GAA structure or the second GAA structure is arranged along a fifth direction rotated 90 degrees clockwise from the third direction; or
the order of directions of current flow of at least one of the first GAA structure or the second GAA structure is arranged along a sixth direction rotated 90 degrees counter clockwise from the third direction.

2. The semiconductor structure of claim 1, wherein
the at least one GAA device further comprises a substrate; and
for a GAA device of the at least one GAA device, one of the first end line or the second end line of the first cross-section is located closer to the substrate and the other of the first end line or the second end line of the first cross-section is located further away from the substrate.

3. The semiconductor structure of claim 1, wherein the first cross-section is tapered towards the first end line.

4. The semiconductor structure of claim 1, wherein the first cross-section is stepwise tapered towards the first end line.

5. The semiconductor structure of claim 1, wherein the first nanowire has a second cross-section taken along the second direction having a circular or elliptical shape.

6. The semiconductor structure of claim 1, wherein the first nanowire has a second cross-section taken along the second direction having a rectangular shape.

7. The semiconductor structure of claim 1, wherein
the first nanowire of a plurality of nanowires of a GAA device of the at least one GAA device has a second cross-section taken along the second direction;
the second cross-section has a first dimension substantially along a third direction of a row of the plurality of nanowires and a second dimension substantially along a fourth direction of a column of the plurality of nanowires;
the first dimension being longer than the second dimension; or
the second cross-section has a third dimension substantially along the fourth direction and a fourth dimension substantially along the third direction;
the third dimension being longer than the fourth dimension.

8. The semiconductor structure of claim 1, wherein a GAA device of the at least one GAA device further comprises:
a first oxide diffusion (OD) region and a second OD region connected to the corresponding first end line and second end line;
the first OD region and the second OD region being arranged such that overlapped areas of the first OD region and the second OD region have substantially the same dimension along the second direction as that of at least one of the first OD region or the second OD region; or
the first OD region and the second OD region being arranged such that the overlapped areas of the first OD region and the second OD region have smaller dimension along the second direction than that of at least one of the first OD region or the second OD region.

9. A semiconductor structure, comprising:
a first gate-all-around (GAA) structure configured to form a first circuit; and
a second GAA structure configured to form a second circuit similar to the first circuit;
wherein
at least one of the first GAA structure or the second GAA structure comprises:
at least one GAA device, at least one of a first GAA device at one end of the at least one GAA device or a second GAA device at the other end of the at least one GAA device comprising:
a corresponding number of at least one nanowire;
a first nanowire of the at least one nanowire having a first cross-section taken along a first direction that is asymmetrical with respect to a middle line of the first cross-section;
the middle line having a second direction substantially orthogonal to the first direction;
the first cross-section having a first end line and a second end line substantially parallel the middle line; and
the first end line being shorter than the second end line; and
a gate region wrapping all around a corresponding portion of the first nanowire of the at least one nanowire; and
the first GAA structure and the second GAA structure are configured in one of the following ways:
if a first current path through the first GAA structure starts from the first end line of the first GAA device and ends with the second end line of the second GAA device, a second current path through the second GAA structure starts from the first end line of the first GAA device and ends with the second end line of the second GAA device; and
if the first current path starts from the second end line of the first GAA device and ends with the first end line of the second GAA device, the second current path starts from the second end line of the first GAA device and ends with the first end line of the second GAA device.

10. The semiconductor structure of claim 9, wherein
an order of directions of current flow along at least one of the first current path or the second current path is arranged along a third direction of current flow along a length of the at least one GAA device;
the order of directions of current flow is arranged along a fourth direction opposite the third direction;

the order of directions of current flow is arranged along a fifth direction rotated 90 degrees clockwise from the third direction; or the order of directions of current flow is arranged along a sixth direction rotated 90 degrees counter clockwise from the third direction.

11. The semiconductor structure of claim 9, wherein
the at least one GAA device further comprises a substrate; and for at least one of the first GAA device or the second GAA device, one of the first end line or the second end line of the first cross-section is located closer to the substrate and the other of the first end line or the second end line of the first cross-section is located further away from the substrate.

12. The semiconductor structure of claim 9, wherein the first cross-section is tapered towards the first end line.

13. The semiconductor structure of claim 9, wherein the first cross-section is stepwise tapered towards the first end line.

14. The semiconductor structure of claim 9, wherein the first nanowire has a second cross-section taken along the second direction having a circular or elliptical shape.

15. The semiconductor structure of claim 9, wherein the first nanowire has a second cross-section taken along the second direction having a rectangular shape.

16. The semiconductor structure of claim 9, wherein
the first nanowire of a plurality of nanowires of a GAA device of the first GAA device and the second GAA device has a second cross-section taken along the second direction;

the second cross-section has a first dimension substantially along a third direction of a row of the plurality of nanowires and a second dimension substantially along a fourth direction of a column of the plurality of nanowires;
the first dimension being longer than the second dimension; or
the second cross-section has a third dimension substantially along the fourth direction and a fourth dimension substantially along the third direction;
the third dimension being longer than the fourth dimension.

17. The semiconductor structure of claim 9, wherein a GAA device of the first GAA device and the second GAA device further comprises:
a first oxide diffusion (OD) region and a second OD region connected to the corresponding at least one first end line and at least one second end line;
the first OD region and the second OD region being arranged such that overlapped areas of the first OD region and the second OD region have substantially the same dimension along the second direction as that of at least one of the first OD region or the second OD region; or
the first OD region and the second OD region being arranged such that overlapped areas of the first OD region and the second OD region have smaller dimension along the second direction than that of at least one of the first OD region or the second OD region.

18. A semiconductor structure, comprising:
a first gate-all-around (GAA) structure configured to form a first circuit; and
a second GAA structure configured to form a second circuit similar to the first circuit;
wherein
at least one of the first GAA structure or the second GAA structure comprises:
at least one GAA device, a GAA device of the at least one GAA device comprising:
a corresponding number of at least one nanowire;
a gate region wrapping all around a corresponding portion of a first nanowire of the at least one nanowire; and
a first oxide diffusion (OD) region and a second OD region connected to a first end and a second end of the first nanowire of the at least one nanowire;
the first end and the second end being on corresponding opposite sides of the portion of the first nanowire wrapped all around by the gate region;
the first nanowire having a first cross-sectional area and a second cross-sectional area at the corresponding first end and second end; and
the first cross-sectional area being smaller than the second cross-sectional area; and
the first GAA structure and the second GAA structure have substantially a same of at least one of the following features:
a number of GAA devices in the at least one GAA device configured to have current flow from the first end to the second end;
a number of GAA devices in the at least one GAA device configured to have current flow from the second end to the first end;
an order of directions of current flow through the first nanowire of the at least one GAA device;
a number of the at least one nanowire for a pair of corresponding GAA devices of the first GAA structure and the second GAA structure;
a number of rows of the at least one nanowire arranged in an array for a pair of corresponding GAA devices of the first GAA structure and the second GAA structure;
a number of nanowires in a row of the at least one nanowire arranged in the array for a pair of corresponding GAA devices of the first GAA structure and the second GAA structure;
a number of columns of the at least one nanowire arranged in the array for a pair of corresponding GAA devices of the first GAA structure and the second GAA structure;
a number of nanowires in a column of the at least one nanowire arranged in the array for a pair of corresponding GAA devices of the first GAA structure and the second GAA structure; or
a shape of the first nanowire for a pair of corresponding GAA devices of the first GAA structure and the second GAA structure.

19. The semiconductor structure of claim 18, wherein
the at least one GAA device further comprises a substrate; and
for a GAA device of the at least one GAA device, one of the first end or the second end is located closer to the substrate and the other of the first end or the second end is located further away from the substrate.

20. The semiconductor structure of claim 18, wherein
the first OD region and the second OD region are arranged such that overlapped areas of the first OD region and the second OD region have substantially the same dimension along a first direction as that of at least one of the first OD region or the second OD region;

the first cross-sectional and the second cross-sectional area being taken along the first direction; or the first OD region and the second OD region are arranged such that the overlapped areas of the first OD region and the second OD region have smaller dimension along the first direction than that of at least one of the first OD region or the second OD region.

\* \* \* \* \*